US008098969B2

(12) United States Patent
Tolstikhin et al.

(10) Patent No.: US 8,098,969 B2
(45) Date of Patent: Jan. 17, 2012

(54) WAVEGUIDE OPTICALLY PRE-AMPLIFIED DETECTOR WITH PASSBAND WAVELENGTH FILTERING

(75) Inventors: Valery Tolstikhin, Ottawa (CA); Fang Wu, Ottawa (CA); Christopher Watson, Ottawa (CA); Yury Logvin, Ottawa (CA); Kirill Pimenov, Ottawa (CA)

(73) Assignee: Onechip Photonics Inc. (CA)

( * ) Notice: Subject to any disclaimer, the term of this patent is extended or adjusted under 35 U.S.C. 154(b) by 293 days.

(21) Appl. No.: 12/632,933

(22) Filed: Dec. 8, 2009

(65) Prior Publication Data
US 2011/0135314 A1    Jun. 9, 2011

(51) Int. Cl.
*G02B 6/12* (2006.01)
(52) U.S. Cl. ........................................ 385/14
(58) Field of Classification Search .................. None
See application file for complete search history.

(56) References Cited

U.S. PATENT DOCUMENTS

| | | | |
|---|---|---|---|
| 5,029,297 A | 7/1991 | Haleman | |
| 5,179,468 A | 1/1993 | Gasloli | |
| 5,299,057 A | 3/1994 | Rideout | |
| 5,428,698 A | 6/1995 | Jenkins | |
| 5,502,783 A * | 3/1996 | Wu | 385/42 |
| 5,574,289 A | 11/1996 | Aoki | |
| 5,596,661 A | 1/1997 | Henry | |
| 6,011,652 A | 1/2000 | Cushing | |
| 6,549,707 B1 | 4/2003 | Carenco | |
| 6,795,622 B2 | 9/2004 | Forrest | |
| 6,909,536 B1 | 6/2005 | Walker | |
| 7,343,061 B2 | 3/2008 | Forrest | |
| 7,423,658 B1 | 9/2008 | Augustssin | |
| 7,444,055 B2 | 10/2008 | Tolstikhin | |
| 7,532,784 B2 | 5/2009 | Tolshikhin | |
| 2007/0104411 A1* | 5/2007 | Ahn et al. | 385/14 |
| 2011/0217045 A1* | 9/2011 | Watson et al. | 398/79 |

OTHER PUBLICATIONS

V. Tolstikhin, "Integrated Photonics: Enabling Optical Component Technologies for Next Generation Access Networks", Proc. Asia Optical Fiber Communication & Optoelectronic Exposition & Conference, Oct. 2007.
V. Tolstikhin, "One-Step Growth Optical Transceiver PICs in InP", Proc. ECOC 2009, Sep. 20-24 2009, Paper 8.6.2.

(Continued)

*Primary Examiner* — Sung Pak
(74) *Attorney, Agent, or Firm* — Perley-Robertson, Hill & McDougall LLP/s.r.l.

(57) ABSTRACT

The invention describes an integrated-photonics arrangement, implementable in a multi-guide vertical integration (MGVI) structure composed from III-V semiconductors and grown in one epitaxial growth run, allowing for the integration of semiconductor optical amplifier (SOA) and PIN photodetector (PIN) structures within a common wavelength-designated waveguide of the plurality of the vertically integrated wavelength-designated waveguides forming the MGVI structure. The integration includes a wavelength filter integrated between the SOA and PIN to reduce noise within the PIN arising from ASE generated by the SOA. In exemplary embodiments of the invention, the wavelength filter is integrated into MGVI structure either within a common wavelength designated waveguide or within the wavelength-designated waveguide. Further in other embodiments the wavelength filter is provided by a thin-film filter abutting a facet of the integrated-photonics arrangement wherein optical signals are coupled by optical waveguides and/or additional optical elements such as a multimode interference device.

19 Claims, 8 Drawing Sheets

OTHER PUBLICATIONS

K.-T. Shiu et al. "A Simple Monolithically Integrated Optical Receiver Consisting of an Optical Preamplifier and p-i-n Photodiode", Photon. Technol. Lett., vol. 18, pp. 956-958, Apr. 2006.

V. Tolstikhin et al, "Optically Pre-Amplified Detectors for Multi-Guide Vertical Integration in InP", Proc. Indium Phosphide and Related Materials 2009, pp. 155-158, Newport Beach, 2009.

Y. Suematsu, et al, "Integrated Twin-Guide AlGaAs Laser with Multiheterostructure", IEEE J. Quantum Electron., vol. 11, pp. 457-460, Jul. 1975.

R. J. Deri et al, "Impedance Matching for Enhanced Waveguide / Photodetector Integration", App. Phys. Lett., vol. 55, pp. 2712-2714, Dec. 1989.

P. V. Studenkov et al, "Efficient Coupling in Integrated Twin-Waveguide Lasers using Waveguide Tapers", IEEE Photon. Technol. Lett., vol. 11, pp. 1096-1098, Nov. 1999.

V. Tolstikhin et al, "Laterally-Coupled DFB Lasers for One-Step Growth Photonic Integration in InP", IEEE Photon. Technol. Lett., vol. 21, pp. 621-623, May 2009.

N. A. Olsson, "Lightwave Systems with Optical Amplifiers", J. Lightwave Technol., vol. 7, pp. 1071-1082, Jul. 1989.

G. Agrawal, "Fiber-Optic Communication Systems", Second Edition, Wiley, 1997.

R.C. Steele, "Sensitivity of Optically Preamplified Receivers with Optical Filtering", IEEE Photon. Technol. Lett., vol. 3, pp. 545-547, Jun. 1991.

L. Soldano et al, "Optical Multi-Mode Interference Devices Based on Self-Imaging: Principles and Applications", J. Lightwave Tech., vol. 13, No. 4, pp. 615-627, Apr. 1995.

W.K. Burns et al, "Optical Waveguide Parabolic Coupling Horns", Appl. Phys. Lett. vol. 30, pp. 28-30, Jan. 1, 1977.

Y. Shibata et al, "Coupling Coefficient Modulation of Waveguide Grating using Sample Grating", IEEE Phot. Tech. Lett., vol. 6, pp. 1222-1224, 1994.

* cited by examiner

WAVEGUIDE OPTICALLY PRE-AMPLIFIED DETECTOR WITH PASSBAND WAVELENGTH FILTERING

FIELD OF THE INVENTION

This invention relates to waveguide photonic devices and photonic integrated circuits and more specifically to waveguide optically pre-amplified detectors in III-V semiconductor materials.

BACKGROUND OF THE INVENTION

Deep penetration of optical fiber into the access networks requires an unparalleled massive deployment of the optical interface equipment that drives the traffic to and from users. For example, optical transceivers, which receive downstream signals on one wavelength and send upstream signals on another wavelength, both wavelengths sharing the same optical fiber, have to be deployed at every optical line terminal (OLT)/optical network unit (ONU). Therefore, cost efficiency and volume scalability in manufacturing of such components are increasingly major issues. It is broadly accepted within the telecommunication industry that optical access solutions are not going to become a commodity service, until volume manufacturing of the optical transceivers and other massively deployed optical components reaches the cost efficiency and scalability levels of consumer products.

Within a framework of the current optical component manufacturing paradigm, which is based mainly on bulk optical sub-assemblies (OSA) from off-the-shelf discrete passive and active photonic devices, the root cause of the problem lies in a labor-intensive optical alignment and costly multiple packaging. Not only do these limit the cost efficiency, but they also significantly restrict the manufacturer's ability to ramp production volumes and provide scalability in manufacturing. The solution lies in reducing the optical alignment and packaging content in the OSA and, eventually, replacing the optical assemblies with photonic integrated circuit (PIC) technologies, in which all the functional elements of optical circuit are monolithically integrated onto the same substrate. Then, the active optical alignment by hand is replaced by automated passive alignment, defined by means of lithography, and multiple component packaging is eliminated altogether, enabling automated and volume-scalable mass production of the complex optical components, based on existing planar technologies and semiconductor wafer fabrication techniques.

In the context of applications, the materials of choice for monolithic PICs for use in the optical transmission systems remain indium phosphide (InP) and its related III-V semiconductors, since they, uniquely, allow for active and passive devices operating in the spectral ranges of interest for optical telecommunications to be combined onto the same InP substrate. In particular, InP PICs, perhaps, are the best hope for a cost-efficient and volume-scalable solution to the most massively deployed components: optical transceivers for the access passive optical networks operating in the 1.3 µm and 1.5 µm wavelength ranges, see for example V. Tolstikhin ("Integrated Photonics: Enabling Optical Component Technologies for Next Generation Access Networks", Proc. Asia Optical Fiber Communication & Optoelectronic Exposition & Conference, October 2007).

Within every optical transceiver is an optical photodetector which converts the received optical signal to an electrical signal allowing for this received signal to be provided to the electrical equipment connected to the telecommunications network, be this a telephone with Voice-over-IP (VoIP), a computer, or a digital TV set-top box for example. Such photodetectors are designed as either PIN diodes with low reverse voltage bias, having a wide, lightly doped 'near' intrinsic semiconductor region between a p-type semiconductor and an n-type semiconductor region, or as avalanche photodiodes (APD) with high reverse voltage bias. Compatibility of PIN diodes with standard CMOS electronics, typical reverse bias voltages being a few Volts rather than many tens of Volts with APDs, low capacitance, and high bandwidth operation have made PIN diodes the preferred choice in network deployments.

As discussed supra PICs are the best hope to achieve the cost-efficient and volume-scalable solution required for access network transceivers. In a monolithic PIC, the PIN diode is implemented within a waveguide structure resulting in waveguide photodetectors (WPD) which are compatible with the passive waveguide circuitry of PICs and thereby facilitate the monolithic integration of the photodetectors with passive wavelength demultiplexing and routing elements. Accordingly, the requirement for a PIC-compatible, high-performance and yet inexpensive PIN WPD is further advanced and essential for this optical fiber penetration into the subscriber customer base and resulting PIC penetration into the access communication systems.

Whilst the drivers for implementing such a PIN WPD are particularly evident within access networks it should be understood that they are a generic device that is particularly attractive at high bit rates, where surface illuminated detectors are limited by carrier transport time-absorption efficiency trade-off, and within PICs, and where any non-waveguide device is difficult to integrate.

A key performance parameter of any photodetector is the responsivity, defined as induced photocurrent relative to incident optical power. It is measured in Amp/Watt (A/W) and can be represented as $R=\eta(e/\hbar\omega)$, where R is the overall quantum efficiency, e is the electron charge and $\hbar\omega$ is the photon energy. Whereas the value of $\eta$ in an on-chip PIN WPD, which greatly depends on the device design, can reach a respectable 70%, see for example V. Tolstikhin, "One-Step Growth Optical Transceiver PICs in InP" (Proc. ECOC 2009, Sep. 20-24, 2009, Paper 8.6.2), still it is always less than unity and hence the responsivity of any PIN detector is fundamentally lower than $e/\hbar\omega$. At the same time, an obvious trend of today's optical network development is to demand higher and higher responsivity at the receiver end. For instance, in a case of an access PON, the constant goal driven by network carriers is towards higher split ratios and longer reach architectures, as these reduce central office equipment and operation costs per subscriber, thereby enabling them to offer lower price to the end customer. As a result some PON standards, such as GPON B+ (ITU-T G.984.2), already require that the detector responsivity is higher than $e/\hbar\omega$ for any conceivable transimpedance amplifier (TIA), to which the photodetector is usually loaded in a receiver circuit. Evidently, this requirement cannot be met with any PIN photodetector, yet alone a PIN WPD, which usually has higher insertion loss and hence somewhat lower quantum efficiency than its surface illuminated counterparts.

To achieve the overall quantum efficiency $\eta>1$, some form of gain must be added between the incoming signal from the optical fiber and the receiver electrical circuit. There are three on-chip solutions to this:

a) electrical gain after detection, e.g. by using a phototransistor, where the signal is amplified once it is already in the electrical domain, which is not exactly a waveguide-based PIC-compatible solution and, in fact, requires an upgrade of a photonic integrated circuit (active and passive waveguide-based photonic devices integrated onto the same substrate) to an optoelectronic integrated circuit (electronic devices integrated on the same substrate with the active and passive waveguide-based photonic devices) at a cost of substantially more complicated and expensive fabrication process;

b) electrical gain in the process of detection, e.g. by utilizing an avalanche photodiode (APD), where the signal is amplified while being transformed from an optical to an electrical domain, which is fundamentally limited in terms of gain-bandwidth product, especially in its waveguide-based implementation, and for this reason is not well suited for integration into PIC for most network applications; and c) optical gain before detection, e.g. in a semiconductor optical amplifier (SOA), where the signal is amplified without leaving the optical domain, which is a waveguide-based solution compatible with the remainder of the PIC design and fabrication processes; hereafter to be referred to as an Optically Pre-Amplified Detector (OPAD).

Because of its compatibility with waveguide-based PIC architectures and fabrication processes, the OPAD appears to be an appropriate PIC solution for a higher than $e/\hbar\omega$ fiber-coupled responsivity, defined as the electric current delivered by the PIC into the receiver circuit relative to the optical power delivered by the optical signal to the PIC. This solution has no specific speed limitation (unless the SOA is in a saturation regime and its optical gain is affected by the amplified optical signal) and is capable of providing end-to-end gain of several tens, thereby enabling superior gain-bandwidth product. For these reasons, design of highly functional, PIC compatible OPAD devices has attracted a considerable interest in recent years.

Any integrated OPAD is, generically, a waveguide-based device, which combines a gain waveguide section (where optical amplification occurs) and a detection waveguide section (where optical conversion to the electrical domain occurs), which are optically connected by a passive waveguide delivering the optical signals to/from the two elements of the OPAD. The monolithic integration of multiple waveguide devices, such as the optical amplifier (OA) and photodetector (PD) required for an OPAD, having different waveguide core regions made from different semiconductor materials can be achieved by essentially one of the three following ways:

1. direct butt-coupling; which exploits the ability to perform multiple steps of epitaxial growth, including selective area etching and re-growth, to provide the multiple semiconductor materials, which are spatially differentiated horizontally with a common vertical plane across the PIC die and the different semiconductor materials are grown adjacent horizontally so that waveguides formed in each directly butt against one another to form the transition from one material to another;

2. modified butt-coupling; which exploits selective area post-growth modification of semiconductor material, e.g. by means of quantum-well intermixing techniques, rather than etching and re-growth, to form the regions of required semiconductor material, also spatially differentiated in the common plane of vertical guiding across the PIC die; and 3. evanescent-field coupling; where vertically separated and yet optically coupled waveguides featuring different semiconductor materials for their core regions, are employed to provide the required material variance without additional growth steps, such that it is now differentiated in the common vertical stack of the PIC die.

Examples of prior art can be found in each of these three categories. The integrated OPAD devices using direct butt-coupling have been reported for example by Haleman et al in U.S. Pat. No. 5,029,297, "Optical-Amplifier-Photodetector Device", W. Rideout et al in U.S. Pat. No. 5,299,057 "Monolithically Integrated Optical Amplifier and Photodetector Tap", and J. Walker et al in U.S. Pat. No. 6,909,536 "Optical Receiver including a Linear Semiconductor Optical Amplifier". An example of modified butt-coupling is presented by M. Aoki et al in U.S. Pat. No. 5,574,289 "Semiconductor Optical Integrated Device and Light Receiver Using Said Device". Finally, an integrated OPAD based on evanescent-field coupling in a vertical twin-waveguide structure has been reported by S. Forrest et al. in U.S. Pat. No. 7,343,061 entitled "Integrated Photonic Amplifier and Detector".

Each of these design solutions has its benefits and drawbacks. Considering direct butt-coupling this allows for a planar integration with minimal vertical topology, which is an advantage from the planar technology point of view since no or minimal planarization is required in the processing of the PIC during fabrication. However, direct butt-coupling requires multiple epitaxial steps to provide the multiple semiconductor materials, which not only creates difficulty in managing optical reflections from these material interfaces, but also significantly affects the fabrication yield and thereby significantly increases the cost of the final PIC devices. Modified butt-coupling can, potentially, remove extra epitaxial steps and in this way improve the fabrication yield, but its capabilities are limited as concerns to the semiconductor material modifications possible: usually, only the bandgap of the quantum well layer(s) can be blue shifted up to some 100 nm, whereas other layers, e.g. heavily doped contact layers, which are needed in active waveguide sections but very undesirable in the passive waveguide sections because of the propagation loss they generate, remain intact. In contrast evanescent field coupling is free from the drawbacks of the butt-coupling approaches above, but, since it is based on the vertical rather than planar integration, it is a somewhat more complicated fabrication process based upon planar technologies, by requiring multiple etching steps at different vertical levels and creating an increased vertical topology.

Consequently evanescent-field coupling is the only practical approach that can be realized in one-step epitaxial growth without any post-growth modification of the semiconductor materials and as such offers the potential for highest fabrication yield in conjunction with a cost-efficient manufacturing process and accordingly potentially lowest cost for PIC devices. It also provides a straightforward solution to the integrated OPAD design based on a twin-waveguide structure, wherein the lower of two vertically coupled waveguides is a passive waveguide with the core layer bandgap well above the photon energy of the optical signals intended for the OPAD, allowing for a low-loss propagation, whereas the upper of the two vertically coupled waveguides is a PIN structure with the intrinsic material bandgap close to that of the spectral range of the optical signal to be handled by the OPAD. This upper waveguide is an active waveguide capable of both optical amplification (under forward electrical bias) or detection (under reverse electrical bias) over the spectral range of interest. Optical coupling between the two waveguides can be implemented with optional lateral tapering to facilitate smooth and controllable vertical transitions for the guided optical signals. In this manner, with proper waveguide and lateral taper designs, the optical signal can be adiabatically transferred from the amplification waveguide section to the detection waveguide section via the passive waveguide section between the two, in which case the passive waveguide section absent the intrinsic active layers and upper contact layers but present the lower contact layers also serves as an electrical insulation between the forward (amplification) and reverse (detection) biased sections of the waveguide PIN. Such an approach being reported for example by K.-T. Shiu et al. in "A Simple Monolithically Integrated Optical Receiver Consisting of an Optical Preamplifier and p-i-n Photodiode" (*Photon. Technol. Lett.*, Vol. 18, PP. 956-958, April 2006) and V. Tolstikhin et al. in "Optically Pre-Amplified Detectors for Multi-Guide Vertical Integration in InP" (Proc. Indium Phosphide and Related Materials 2009, pp. 155-158, Newport Beach, 2009). Tolstikhin et al reporting a fiber-coupled responsivity 10 times greater than e/$\hbar\omega$ with a polarization sensitivity of less than 0.4 dB over a 50 nm wavelength bandwidth, with an injection current of approximately 150 mA in the OPAD operating around 1490 nm at room temperature.

Twin-guide integration of active and passive waveguides is the simplest and most common example of the evanescent-field based vertical integration, and can be implemented in a variety of forms, e.g. based upon phase matching in either a conventional directional coupler (DC), see for example Y. Suematsu, et al in "Integrated Twin-Guide AlGaAs Laser with Multiheterostructure" (*IEEE J. Quantum Electron.*, Vol. 11, pp. 457-460, July 1975); or a DC enhanced by an impedance matching layer between the coupled optical waveguides, see for example R. J. Deri, et al in "Impedance Matching for Enhanced Waveguide/Photodetector Integration" (*App. Phys. Lett.*, Vol. 55, pp. 2712-2714, December 1989); or a DC with lateral taper assisted coupling between the twin waveguides, see for example P. V. Studenkov, et al in "Efficient Coupling in Integrated Twin-Waveguide Lasers using Waveguide Tapers" (*IEEE Photon. Technol. Lett.*, Vol. 11, pp. 1096-1098, November 1999).

Multi-guide vertical integration (MGVI) is an extension of this approach towards multi-functional PICs, wherein optical waveguides with different functions are vertically stacked in order of ascending waveguide bandgap wavelength and evanescent-field coupled with each other, while adiabatic transition between the vertically disposed waveguides are affected by lateral tapers defined at requisite vertical guiding levels and acting coherently with each other, see for example V. Tolstikhin, et al in "Laterally-Coupled DFB Lasers for One-Step Growth Photonic Integration in InP" (*IEEE Photon. Technol. Lett.*, Vol. 21, pp. 621-623, May 2009); V. Tolstikhin et al in "Optically Pre-Amplified Detectors for Multi-Guide Vertical Integration in InP" (Proc. Indium Phosphide and Related Materials 2009 Conference, pp. 155-158, Newport Beach, 2009); and also V. Tolstikhin et al in U.S. Pat. No. 7,444,055 entitled "Integrated-Optics Arrangement for Wavelength (De)Multiplexing in a Multi-Guide Vertical Stack".

A key feature of the MGVI approach that differentiates it from a consecutive twin-guide integration of the prior art described supra within the same multi-guide vertical stack is an ability for an optical signal in a multi-functional PIC having more than two vertically stacked and evanescent-field coupled optical waveguides to be adiabatically transferred between these waveguides with the aid of lateral tapers defined in at least some of the vertical guiding levels and, in use, acting coherently with each other. This may be qualified as a parallel adiabatic transfer, opposite to a serial adiabatic transfer, in which no more than two vertically stacked guides are evanescent-field coupled simultaneously and if the PIC structure has more than two functions and hence more than two guiding vertical levels, the transition of the optical signals between them is achieved by consecutive transitions between two adjacent waveguides, to the exclusion of all the other guiding layers in the process. An example of such parallel and serial approaches to an evanescent-field based integration in a multi-guide vertical stack are given by V. Tolstikhin et al. in U.S. Pat. No. 7,532,784 entitled "Integrated Vertical Wavelength (De)multiplexer" and S. Forrest et al. in U.S. Pat. No. 6,795,622 entitled "Photonic Integrated Circuits", respectively.

Disregarding the particular active-passive waveguide integration technique (i.e. planar butt-coupling or vertical evanescent-field coupling) or its particular implementation (e.g. parallel or serial approach to a vertical integration based on evanescent-field coupling), any OPAD device should, fundamentally, provide a gain-enhanced responsivity without significant deterioration of the signal to noise ratio. In other terms, as a component to be used for a signal transfer from an optical into electrical domain in a receiver, the OPAD should ideally combine high gain with low noise. The major source of noise specific to the OPAD that adds to the other, rather generic, noise sources, such as thermal and shot noise in the receiver circuit, is the Amplified Spontaneous Emission (ASE) generated in the amplification section of the OPAD. ASE being inherent in optical amplifiers irrespective of design be it monolithic, such as an OPAD, hybrid, or fiber based, such as an Erbium Doped Fiber Amplifier (EDFA). If and when ASE related noise becomes the major contributor to the receiver noise, then the optical signal amplification provided by the OPAD does not help much since it worsens the signal to noise ratio and, eventually, the receiver sensitivity, in spite of increasing its responsivity. This aspect of the OPAD performance is critical to device applications, notably in the extended reach/increased split ratio PON's, but has not been addressed properly in prior art OPAD designs.

For a better understanding of the impact that ASE may have on receiver sensitivity, as well as the ways to reduce it, it is instructive to consider current fluctuations within the receiver circuit, generated by ASE. An estimate of the current mean-square value of the induced photocurrent neglecting all the noise sources but the thermal noise (usually determined by the equivalent input noise of the trans-impedance amplifier, to which the detector is loaded) can be written down as described in Equation (1) below:

$$i_N^2 \approx i_D^2 + \mathfrak{R}_D^2 B_e E_{ASE}(B_o E_{ASE} + 4G\bar{P}), \quad (1)$$

where $i_D$ is the RMS noise current in a receiver circuit, generated by a device having similar PIN detector but no optical amplifier, and the second term on the right hand side accounts for the excessive ASE related noise generated by the optical pre-amplifier, which results from a combination of the spontaneous-spontaneous and spontaneous-signal beatings, represented by the first and second terms in the parentheses on the right hand side of this equation, respectively (e.g. N. A. Ollson, *J. Lightwave Technol.*, Vol. 7, PP. 1071-1082, July 1991). Here, $\mathfrak{R}_D$ is the responsivity relative to the optical power in front of the detection section, $E_{ASE}$ is the spectral density of the ASE power at the input of the detection section, $B_e$ is the receiver circuit bandwidth, $B_o \approx (c\Delta\lambda_{PBF})/\lambda^2$ is the frequency bandwidth equivalent to the optical wavelength passband $\Delta\lambda_{PBF}$ in a transition from the amplification to the detection waveguide sections, G is the waveguide-referred aggregate gain, and P is the time averaged waveguide-coupled optical power of the signal.

If the receiver noise is determined mainly by sources other than ASE, i.e. the first term of Equation 1 is dominant, then the waveguide coupled sensitivity is estimated as given by Equation (2) below:

$$\overline{P_{min}} \approx \frac{i_D}{R_D} \frac{Q}{G}, \qquad (2)$$

where Q is the Q-factor under the assumption that the noise is Gaussian; the receiver decision circuit threshold is set to give equal error probability for both 1 or 0 bits of the data signal (see G. Agrawal in "Fiber-Optic Communication Systems", Second Edition, Wiley, 1997), and the average power in the 1 bit, $P_1$, is much higher than in 0 bit, $P_0$, i.e. $\overline{P} \approx P_1/2$. In the other case, when the second term of Equation (1) dominates, i.e. in the ASE noise limited regime, the waveguide-coupled receiver sensitivity can be approximated as shown below in Equation (3) below to approximate the minimum optical power, $\overline{P_{min}}$:

$$\overline{P_{min}} \approx hv \cdot B_e \cdot F_g \cdot Q \cdot \left( Q + \sqrt{\frac{B_o}{B_e}} \right), \qquad (3)$$

where hv is the photon energy and $F_g$ is the noise factor of the OPAD amplification section (see R. C. Steele et al in "Sensitivity of Optically Preamplified Receivers with Optical Filtering" *IEEE Photon. Technol. Lett.*, Vol. 3, PP 545-547, June 1991).

Equations (1) through (3) provide instructive insights on both the limits of OPAD performance and optimization. First, as long as the receiver noise is determined by the factors other than ASE, i.e. while the aggregate gain is relatively low, increase of the gain lowers $\overline{P_{min}}$, as can be seen from Equation (2), and thereby improves the receiver performance. Second, in the ASE noise limited regime, i.e. when the aggregate gain gets high, further increase of the gain has no benefit since this results in a saturation of $\overline{P_{min}}$, as can be seen from Equation (3). Third, at least part of the ASE noise, that associated with the spontaneous-spontaneous beatings, can be suppressed by inserting a wavelength filter between the amplification and detection sections of the OPAD sections, such that the filter's passband is wide enough to allow through all the signal wavelengths, but, at the same time, is narrower than the spontaneous-spontaneous beating bandwidth.

In this manner the optical signals in the predetermined narrow wavelength range pass through and are detected in the photodetector section, whereas the ASE noise does not. It can be re-routed away from the detection section of the OPAD, or absorbed within the intervening PIC circuitry before the detection section, or both, such that the OPAD noise related to ASE is limited to that in the intended wavelength range of the received signal.

Accordingly, the invention provides for an improvement in the OPAD performance by providing MGVI compatible design solutions featuring passband filtering between amplification and detection of the received optical signals. In this way, the performance improvement is combined with the capabilities and advantages of the one-step epitaxial growth MGVI technique, thereby providing highly functional and low cost PIC solutions to OPAD based receivers for mass deployment, e.g. in the extended reach/increased split ratio PON's.

OBJECT OF THE INVENTION

The object of the invention is an integrated OPAD design, compatible with the MGVI platform, that enhances the device performance by providing on-chip ASE filtering outside the signal wavelength range and, in this manner, reducing the impact of ASE related noise on the sensitivity of the OPAD based receiver, while providing greater than $e/\hbar\omega$ receiver responsivity. The ASE filtered OPAD being formed in the MGVI platform such that, in use, the amplification and detection waveguide sections are formed within the same wavelength-designated active waveguide layer while passive waveguide sections and elements of waveguide circuitry are defined within the passive waveguide layer, the passive waveguide layer positioned below the active waveguide layer in a multi-guide vertical stack, which also may comprise other wavelength-designated active and passive waveguide layers. All elements of the MGVI photonic circuit being implemented in one epitaxial growth step and monolithically integrated on one substrate. In accordance with the MGVI design principles, see V. Tolstikhin et al in U.S. Pat. No. 7,532,784 entitled "Integrated Vertical Wavelength (De)Multiplexer" and U.S. Pat. No. 7,444,055 entitled "Integrated Optics Arrangement for Wavelength (De)Multiplexing in a Multi-Guide Vertical Stack", the passband wavelength filter may be implemented either internally within the MGVI structure or externally to the MGVI structure.

SUMMARY OF THE INVENTION

It is an object of the present invention to obviate or mitigate at least one disadvantage of the prior art.

In accordance with another embodiment of the invention there is provided a photonic component comprising:
a) an epitaxial semiconductor structure grown in a III-V semiconductor material system in a single growth step upon a substrate comprising a common designated waveguide for supporting propagation of optical signals within a predetermined first wavelength range and at least one of a plurality of wavelength designated waveguides vertically disposed in order of increasing wavelength bandgap, each of the plurality of wavelength designated waveguides supporting a predetermined second wavelength range, each of the predetermined second wavelength ranges being within the predetermined first wavelength range;
b) an optical input port for receiving optical signals within the first wavelength range;
c) a first filter comprising at least a first output port and a second output port and characterized by at least a first passband width, the filter optically coupled to the optical input port for receiving optical signals within the first wavelength range and for providing a first predetermined portion of the received optical signals to the first output port, the first predetermined portion of the received optical signals being determined in dependence upon at least the first passband width;
d) an optical amplifier comprising at least a gain section formed within the one of the plurality of wavelength designated waveguides, a first contact for forward biasing the optical amplifier, and a third output port, the optical amplifier optically coupled to the first output port for receiving the first predetermined portion of the received optical signals and providing amplified filtered optical signals to the third output port;
e) a second filter comprising at least a fourth output port and a fifth output port and characterized by at least a second passband width, the filter optically coupled to the third output port of the optical amplifier and for providing a first predetermined portion of the amplified filtered optical signals to the fourth output port and a second predetermined portion of the amplified filtered optical signals to the fifth output port, the first and second predetermined portions of the amplified filtered optical signals being determined in dependence upon at least the second passband width;

f) a first photodetector optically comprising at least a second contact for reverse biasing the first photodetector, the first photodetector being coupled to the fourth output port of the second filter for receiving the first predetermined portion of the amplified filtered optical signals;

g) a second photodetector optically coupled to the fifth output port of the second filter for receiving the second predetermined portion of the amplified filtered optical signals; and h) a third photodetector optically coupled to the second output port of the first filter for receiving a predetermined portion of optical signals propagating from the optical amplifier to the first filter, the predetermined portion of the optical signals determined in dependence upon at least the first passband width; wherein, the first contact and second contact are formed upon the same layer of the epitaxial semiconductor structure but are electrically isolated from one another.

In accordance with another embodiment of the invention there is provided a photonic component comprising:

a) an epitaxial semiconductor structure grown in a III-V semiconductor material system grown in a single growth step upon a substrate comprising a common designated waveguide for supporting propagation of optical signals within a predetermined first wavelength range and at least one of a plurality of wavelength designated waveguides vertically disposed in order of increasing wavelength bandgap, each of the plurality of wavelength designated waveguides supporting a predetermined second wavelength range, each of the predetermined second wavelength ranges being within the predetermined first wavelength range;

b) an optical input port for receiving optical signals within the first wavelength range;

c) an optical amplifier comprising at least a gain section formed within the one of the plurality of wavelength designated waveguides, a first contact for forward biasing the optical amplifier, and a first output port, the optical amplifier optically coupled to the optical input port for receiving the optical signals and providing amplified optical signals to the first output port;

d) a first filter comprising at least a second output port and characterized by at least a first passband width, the filter optically coupled to the first output port of the optical amplifier and for providing a first predetermined portion of the amplified optical signals to the second output port, the first predetermined portion of the amplified optical signals being determined in dependence upon at least the first passband width;

e) a first photodetector optically comprising at least a second contact for reverse biasing the first photodetector, the first photodetector being coupled to the second output port of the first filter for receiving the first predetermined portion of the amplified optical signals; wherein the first contact and second contact are formed upon the same layer of the epitaxial semiconductor structure but are electrically isolated from one another.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention is directed to an integrated optically pre-amplified detector (OPAD) with a passband wavelength filter between amplification and detection sections of the device, which filter is intended to reduce an impact of amplified spontaneous emission generated in the amplification section of the device on broadband noise generated in the detection section of the device, thereby enhancing signal to noise ratio in and improving performance of an optical receiver featuring optically pre-amplified detector.

Reference may be made below to specific elements, numbered in accordance with the attached figures. The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

References to optical waveguides are made typically by reference to etched ridge waveguide structures and identified by the ridge element in the uppermost layer of each etched ridge waveguide structure. Such referencing is intended to simplify the descriptions rather than implying the optical waveguide of any element solely comprises the upper etched ridge element identified. The scope of the present invention as one skilled in the art would appreciate is not intended to be limited therefore to such etched ridge waveguides as these represent only some of the possible embodiments.

Figure 1A:
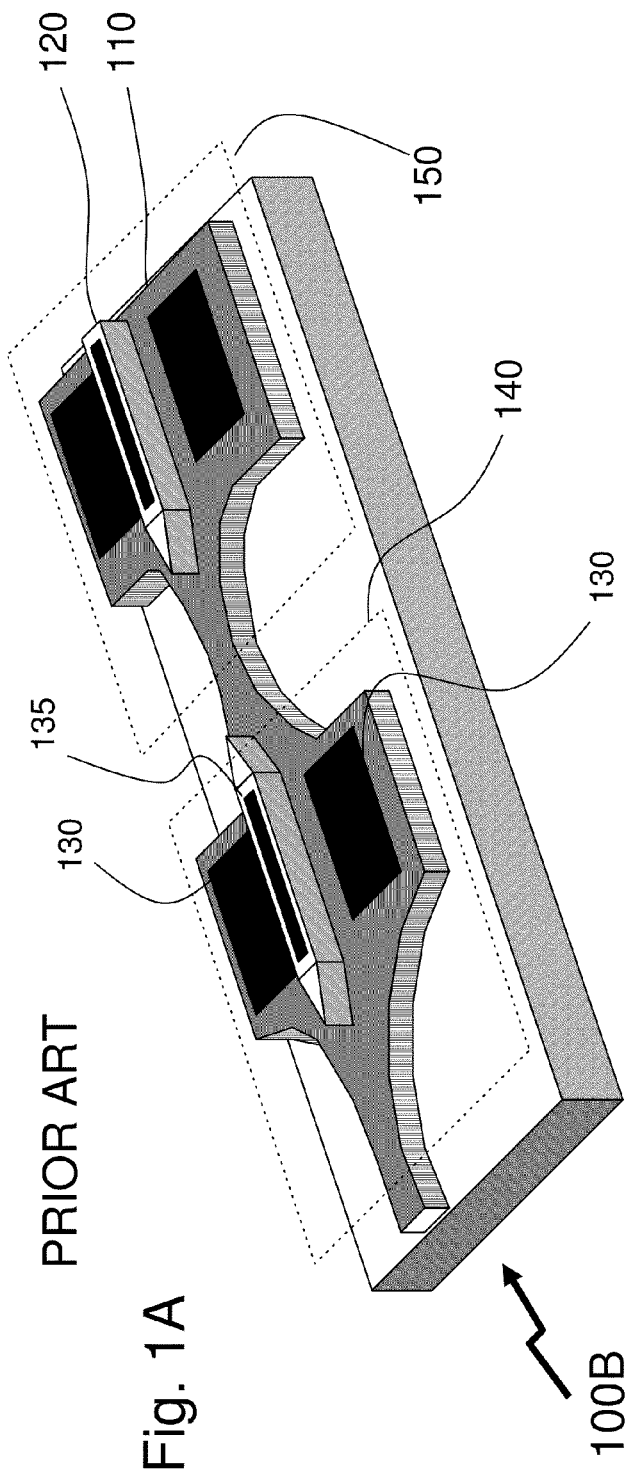
FIG. 1A depicts an OPAD according to the prior art of Tolstikhin et al in "Optically Pre-Amplified Detectors for Multi-Guide Vertical Integration in InP" (Proc. IPRM 2009)

Referring to FIG. 1A there is depicted an integrated OPAD 100A according to the prior art of V. Tolstikhin et al in "Optically Pre-Amplified Detectors for Multi-Guide Vertical Integration in InP" (Proc. IPRM 2009). OPAD 100A comprises passive and active waveguides, being depicted by structures 110 and 120 respectively, which are vertically stacked with respect to each other such that the passive waveguide 110 is below and is designed to be transparent in the designated wavelength range of the upper active waveguide 120. Laterally, the waveguides are defined by etching a shallow ridge for the passive waveguide 110 and a deep ridge for active waveguide 120. The terms "shallow" and "deep" ridge hereafter being used to identify ridge waveguide designs with the etch stopping above and going through the guiding layer, respectively. The deep etched active waveguide 120 actually forms a mesa, with N-contacts 130 to the active waveguide PIN structures deposited aside from the mesa, on the passive waveguides' 110 top surface. The P-contact being formed at the mesa's top surface, being the upper surface of active waveguide 120. In this way, an electrical insulation between the amplification section 140 and detection section 150 of the active waveguide PIN, which are forward and reverse biased respectively, while sharing the common ground, i.e. the N-contact, is achieved by etching away material of the mesa between these two sections. A similar design approach as discussed supra being reported by S. Forrest et al in U.S. Pat. No. 6,795,622 entitled "Photonic Integrated Circuits".

Whereas a simple insulation trench between the two PIN structures would provide such an electrical isolation, it also would break abruptly the active waveguide, resulting in an undesirable light loss on the transition from the amplification to the detection sections. Not only is such a loss undesirable since it has to be compensated with more gain that will generate more ASE related noise, but as it concerns to the PIC environment, excessive light scattering at the output of the amplification section will also result in an optical cross-talk to other optical circuit elements. Therefore, a low insertion loss transition between the amplification and detection sections of the active waveguide via adiabatic transition from the amplification section to the passive waveguide section and then from the passive waveguide section to the detection section is a more preferable solution. This still provides the electrical insulation between the two oppositely biased active waveguide sections. In practice, such an adiabatic transition is achieved by a proper tapering of the active waveguide and, possibly, passive waveguide in the transition area, as is shown in FIG. 1, although not explicitly identified.

Lateral taper assisted adiabatic vertical transitions of the optical signal between the active waveguide 120 and passive waveguide 110 and vice-versa are a design solution that can reduces the insertion loss between the electrically insulated amplification section 140 and detection section 150 to between 1 dB and 2 dB (see V. Tolstikhin et al in "Optically Pre-Amplified Detectors for Multi-Guide Vertical Integration in InP" (Proc. IPRM 2009, pp. 155-158, Newport Beach, 2009). Unfortunately, these vertical transitions are not really wavelength selective and as such will transfer the broadband ASE generated in the amplification section 140 to the detection section 150, where it will result in both signal-ASE and ASE-ASE beating noise, generating these with equal efficiency.

Figure 1B:
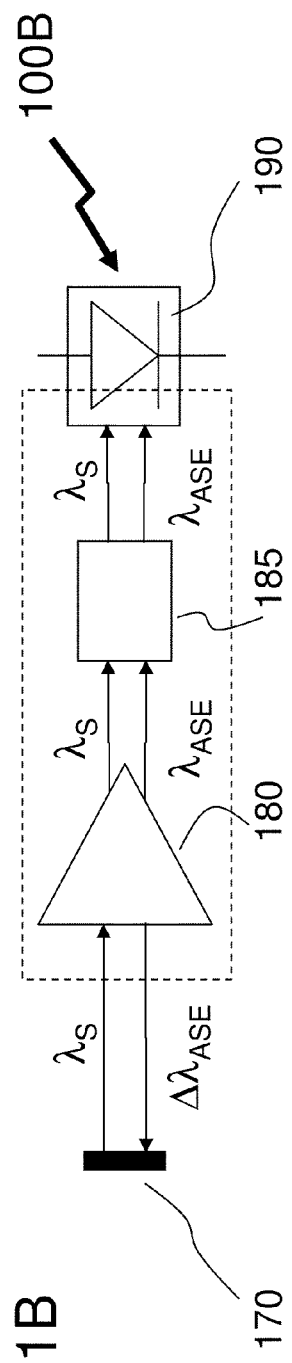
FIG. 1B depicts a schematic of the functionality provided by the prior art of Tolstikhin in respect of an OPAD.

As such the effective circuit configuration is as depicted in FIG. 1B by circuit 100B comprising optical gain block 180 and photodetector 190. An optical signal at wavelength $\lambda_s$ is fed into the circuit 100B from optical input 170 and coupled to the optical gain block 180. From the optical gain block 180 an amplified optical signal at wavelength $\lambda_s$ is propagated forward to the photodetector 190 via transition block 185 which represents the effect of the two optical transitions between the active and passive waveguides. Also coupled from the optical gain block 180 are forward and backward propagating ASE signals to the optical input 170 and photodetector 190 respectively, these ASE signals having a wavelength spectrum $\lambda_{ASE}$. The forward propagating ASE signal propagates essentially unaffected in respect of wavelength spectrum through the two optical transitions between the active and passive waveguides albeit with reduced optical power due to the insertion losses of these interfaces (typically 0.5 dB-1.0 dB each as reported by V. Tolstikhin et al in "Optically Pre-Amplified Detectors for Multi-Guide Vertical Integration in InP" (Proc. IPRM 2009, pp. 155-158, Newport Beach, 2009).

Figure 2:
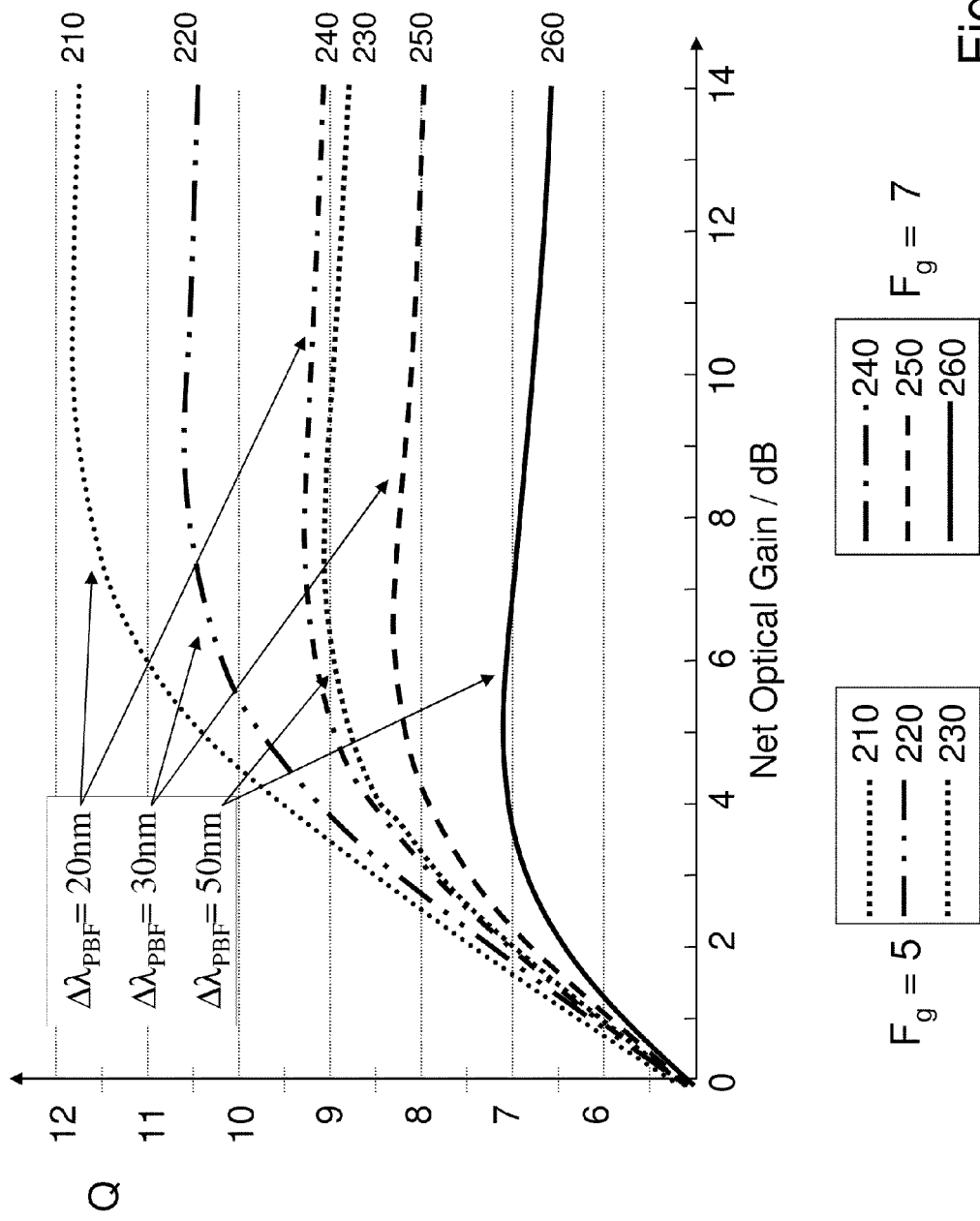
FIG. 2 depicts the Q factor for an OPAD receiver versus optical gain with varying filter bandwidth.

The impact of ASE on the receiver signal to noise ratio is illustrated by the results of calculations shown in FIG. 2, where the Q-factor is given as a function of the net gain for signals with varying ASE filtered spectral width $\lambda_{PBF}$ and is presented based upon the analysis presented supra. Referring to the application of the OPAD within fiber-to-the-home optical access, all the important noise contributions in the optical (transmitter relative intensity noise, shot and thermal noises in the waveguide detector) and electrical (represented by the equivalent input noise in front-end amplifier, $i_{EIN}^2$) circuits of a receiver are taken into account in accordance to GPON ITU standards (ITU-T G.984.2). It can be seen from FIG. 2, that while Q-factor trends to saturate as a function of the net gain, the saturation level occurs at lower Q and net optical gain when the gain section noise factor $F_g$ is higher (i.e. $F_g=7$). Reducing the gain section noise factor (i.e. $F_g=5$) and/or limiting the optical passband of the ASE (i.e. filtering out ASE outside the passband $\Delta\lambda_{PBF}$) increases the achievable Q-factor. Reaching a value of Q exceeding 7, which corresponds to a bit-error rate $10^{-12}$, is feasible when the input noise of a front-end amplifier, $i_{EIN}$ is set to a value of 3.5 pA/$\sqrt{Hz}$, i.e. that of commercially available TIAs, as employed in these calculations for the optical passband $\Delta\lambda_{PBF}$ of 50 nm or less. The calculations in FIG. 2 were performed for an electrical bandwidth, $B_e$, of 1.8 GHz, suitable for 2.5 Gb/s transmission, at a centre wavelength of 1490 nm. As shown first to third curves 210 to 230 represent performance curves for gain section noise factor $F_g=7$ for bandwidths of 20 nm, 30 nm, and 50 nm respectively. Fourth to sixth 240 to 260 represent performance curves for gain section noise factor, $F_g=7$, for bandwidths of 20 nm, 30 nm, and 50 nm respectively.

For the optical passband filter to have a positive effect on the receiver sensitivity, by reducing the ASE-ASE beating noise, the filter passband $\Delta\lambda_{PBF}$ should be narrower than the ASE spectrum width under operating conditions, $\lambda_{ASE}$, but wider or equal to the wavelength range width of the pre-amplified optical signal, $\lambda_S$. In a typical waveguide semiconductor optical amplifier featuring bulk or quantum well active layers and providing ~5 dB-7 dB of the net gain the ASE spectrum width is wider than 50 nm and possibly exceeds 100 nm, while the signal wavelength range width is usually narrower, e.g. 20 nm in the case of EPON or GPON ONU data receivers or 10 nm in the case of GPON ONU video receivers, leaving some room for a designer to squeeze within the inequality $\lambda_S \leq \lambda_{PBF} \leq \lambda_{ASE}$ by a proper choice of the filter passband width. Within such a passband, both the signal and ASE will be transmitted from the amplification into detection section of the OPAD, whereas all the wavelengths outside the passband will be rejected and hence will not contribute to the receiver noise.

Therefore, it is evident from FIG. 2 that it would be an improvement for integrated OPAD designs if, while remaining within the framework of a solution that enables electrical insulation between the amplification and detection sections of the active waveguide at a minimal optical loss, it also provided a passband wavelength filtering to reduce the impact of ASE generated within the amplification section on the overall receiver noise. It would be further advantageous to make such a solution or solutions compatible with the MGVI platform and, accordingly, make the integrated OPAD not only a highly functional device, but also an important building block of cost-efficient PIC receivers and transceivers.

Figure 3:
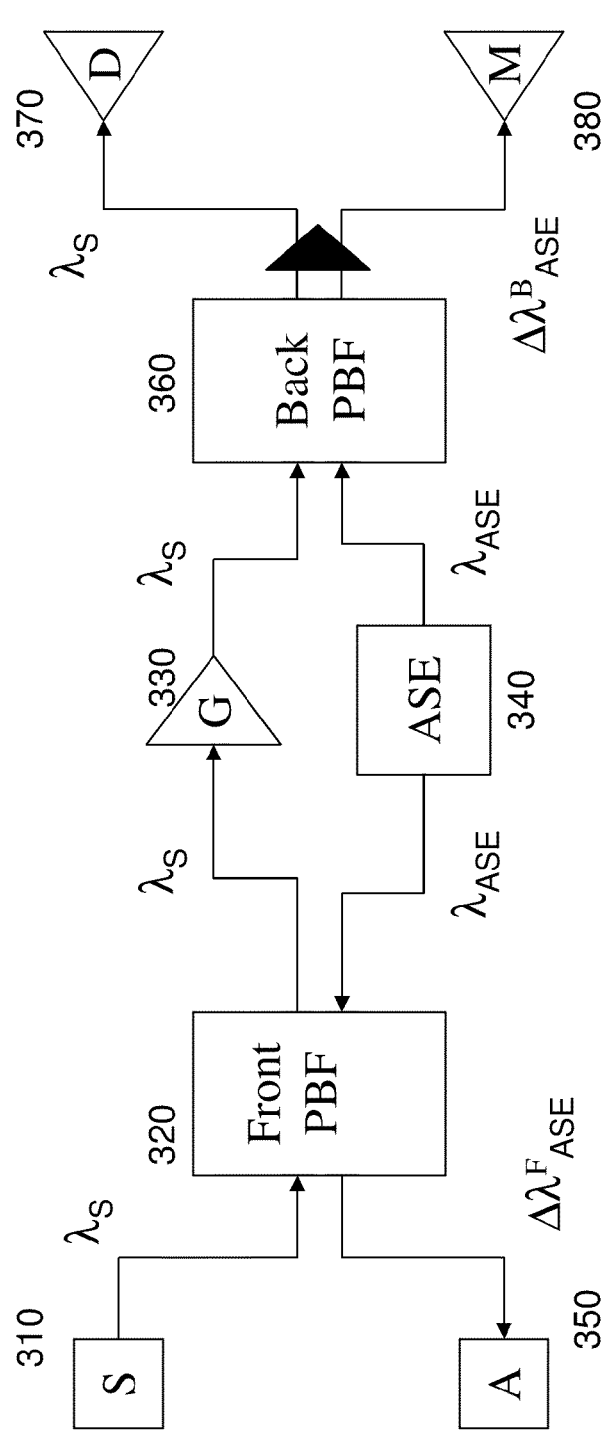
FIG. 3 depicts a schematic of the functionality provided by the invention.

Referring to FIG. 3 there is a schematic which represents an OPAD 300 according to embodiments of the invention wherein passband filtering elements are employed both between the optical amplification and detection sections of the OPAD 300 and between the preceding optical circuitry or network and the optical amplification section of the OPAD 300. The former is a must for any embodiment of the invention, whereas the latter is optional and as such serves a purpose of preventing undesirable ASE light into preceding optical circuit or network.

In a case of the optical filters employed both at the front and back side of the amplification section of OPAD 300, the optical signals in the wavelength range $\lambda_S$ enter the OPAD 300 at Source 310 and are coupled to the Front Passband Filter (PBF) 320. The Front PBF 320 has a wavelength passband width $\Delta\lambda_{PBF}^F$, such that it includes all the signal wavelengths, and thereby transmits the incoming optical signals into the amplification section (Gain Element) 330. Wavelengths outside the passband range $\Delta\lambda_{PBF}^F$ are rejected and re-routed to Absorber 350, where the optical signals they bear are absorbed and thereby prevented from propagating further into OPAD 300. Since the Front PBF 320 has to transmit all the incoming optical signals to Detector Element 360, $\Delta\lambda_{PBF}^F$ should include all the signal wavelengths, i.e. $\Delta\lambda_{PDBF}^F \geq \lambda_S$. At the same time, it should, ideally, exclude all the wavelengths outside the signal wavelength range $\lambda_S$, suggesting that in a properly designed device $\Delta\lambda_{PDBF}^F \approx \lambda_S$. In the case where no Front PBF 320 is provided, and accordingly there is no Absorber 350 at the front side of the amplification section, the incoming optical signals are transmitted from the Source 310 directly into the Gain Element 330.

In either case, the incoming optical signals are amplified in the Gain Element 330 and are then coupled forward to the Back PBF 350, wherein they are filtered according to its passband $\Delta\lambda_{PBF}^B$, such that the wavelengths within this passband propagate further to the detection section of the OPAD 300, namely Detector Element 360, whereas the wavelengths outside this passband range are rejected and, optionally, routed to the Monitor Element 370, this being for example another photodetector, thereby providing a feedback signal allowing control over the net gain in the amplification section (Gain Element 330). Since the Back PBF 360 has to transmit all the incoming optical signals to Detector Element 370, $\Delta\lambda_{PBF}^B$ should include all the signal wavelengths, i.e. $\Delta\lambda_{PDBF}^B \geq \lambda_S$ and, preferably, exclude all the wavelengths outside the signal wavelength range $\lambda_S$, i.e. $\Delta\lambda_{PDBF}^F \approx \lambda_S$ in the optimum design.

Besides providing a required amplification of the incoming optical signals prior to their detection in the Detector Element 360, the Gain Element 330 also generates undesired ASE, which is denoted by adding an ASE Element 380 in parallel with the Gain Element 330 in a block-diagram presented in the FIG. 3. This ASE is characterized by a wavelength range $\lambda_{ASE}$, which basically overlaps with the net gain range $\lambda_G$ of the Gain Element 330, and propagates both forward and backwards from the ASE Element 340 within the OPAD 300.

Backwards propagating ASE $\lambda_{ASE}$ in the signal wavelength range $\lambda_S$ is transmitted into preceding optical circuit or network (schematically represented by Source 310) both in the case where there is a Front PBF 320 and when there is no Front PBF 320. However, where these is a Front PBF 320 then signals outside the signal wavelength range $\lambda_S$ can be rejected by the Front PBF 320 and then absorbed in Absorber Element 340, thereby reducing ASE penetration into the preceding circuit or network.

Forward propagating ASE in the signal wavelength range $\lambda_S$ is transmitted into the Detector Element 360, along with the pre-amplified incoming signals, by the Back PBF 360. However, ASE signals outside the signal wavelength range $\lambda_S$ are rejected in all the embodiments of the invention. These rejected signals, optionally, are re-routed to and detected in the Monitor Element 370, to provide a control over the Gain Element 330, or are otherwise absorbed, dissipated, or routed.

In accordance to Equation (3) above, the effect of the Back PBF 350 on the receiver noise is estimated as a reduction of the ASE-ASE beating contribution to the broadband noise by the factor of $\sqrt{\Delta\lambda_{ASE}/\Delta\lambda_{PBF}^B} \leq \sqrt{\Delta\lambda_{ASE}/\Delta\lambda_S}$. It may be significant, thereby improving the OPAD 300 performance, if $\Delta\lambda_{ASE} \gg \Delta\lambda_S$, e.g. in the devices with a broad gain spectrum and narrow signal wavelength range, but if, otherwise, $\Delta\lambda_{ASE} \leq \lambda_S$, ASE filtering does not really improve the OPAD performance and hence makes no sense.

Figure 7:
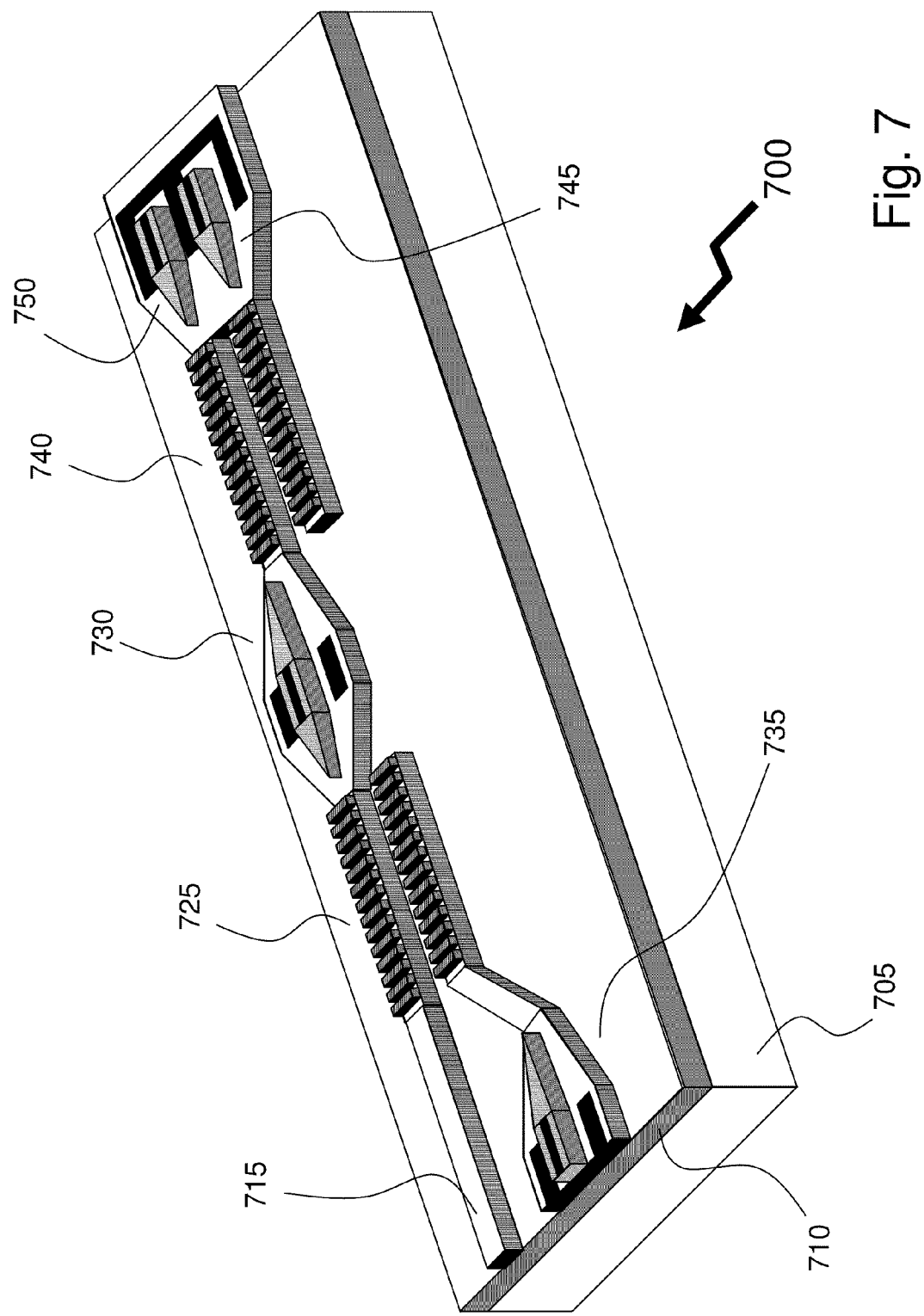
FIG. 7 depicts an OPAD according to an embodiment of the invention wherein wavelength filtering between the optical amplifier and photodetector is achieved through a grating assisted coupling structure and a second grating assisted coupling structure couples a corresponding filtered broadband noise signal from the front facet of the optical amplifier to a monitoring photodetector.

Accordingly, the block-diagram of the OPAD 300 with ASE filtering, as given in FIG. 3, represents the most generic solution and approach to the problem, which is not limited to any specific OPAD design, nor does it depend on the design of the PBF elements and the re-routing waveguide elements. Embodiments presented below in respect of FIG. 4 through to FIG. 7, represent some particular designs of the Back PBF 360 element described supra in respect of OPAD 300 of FIG. 3. These being implementable using a range of optical waveguide circuit elements and arrangements. These waveguide circuits and arrangements are embodiments for illustration only and do not represent all potential embodiments which lie within the scope of the claims.

Figures 4A, 4B:
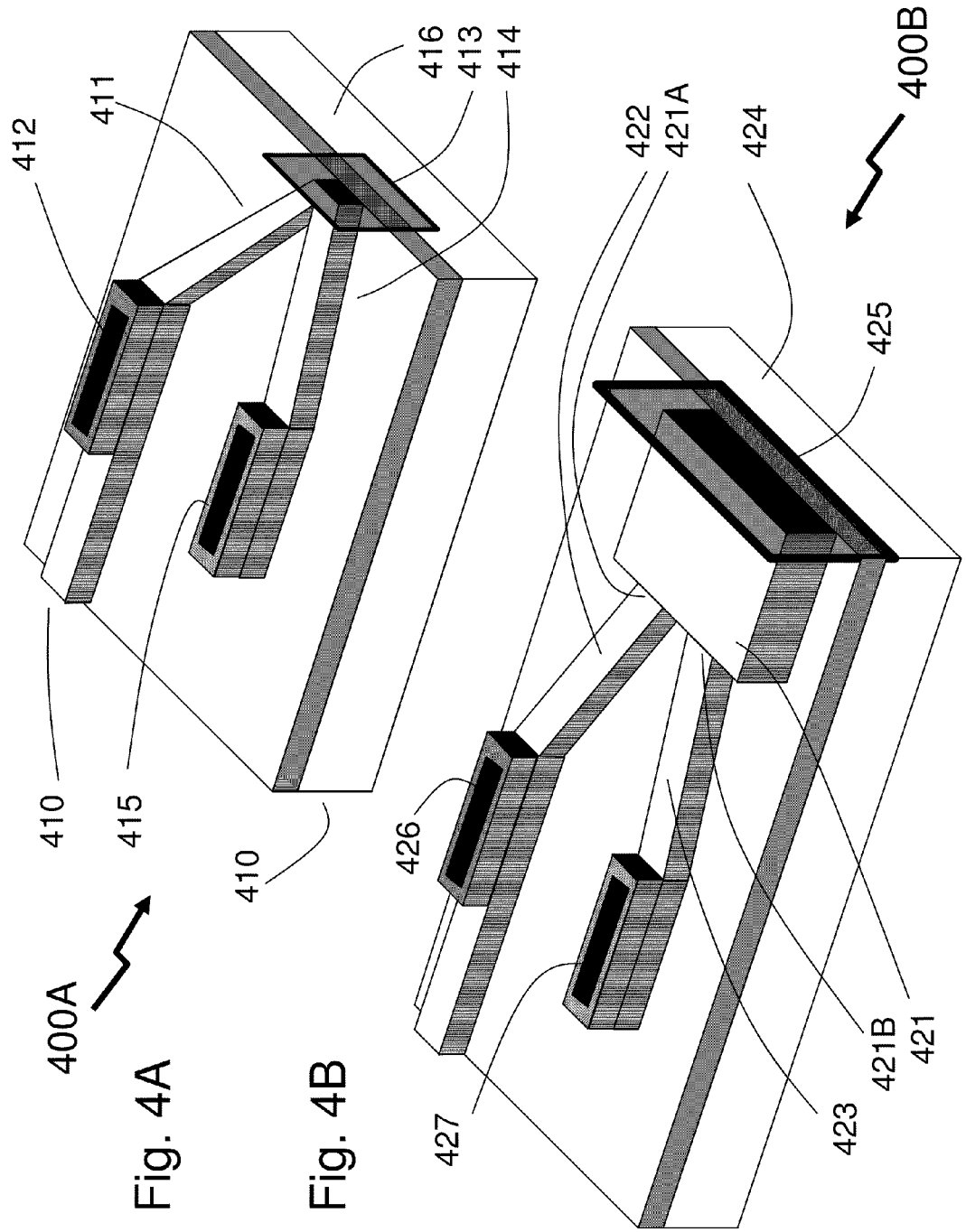
FIG. 4A depicts an OPAD according to an embodiment of the invention wherein wavelength filtering is achieved through a reflective interface and thin-film filter with a waveguide interface at the circuit edge.
FIG. 4B depicts an OPAD according to an embodiment of the invention wherein wavelength filtering is achieved through a reflective interface and thin-film filter in conjunction with a multimode interference coupler.
Figure 4C:
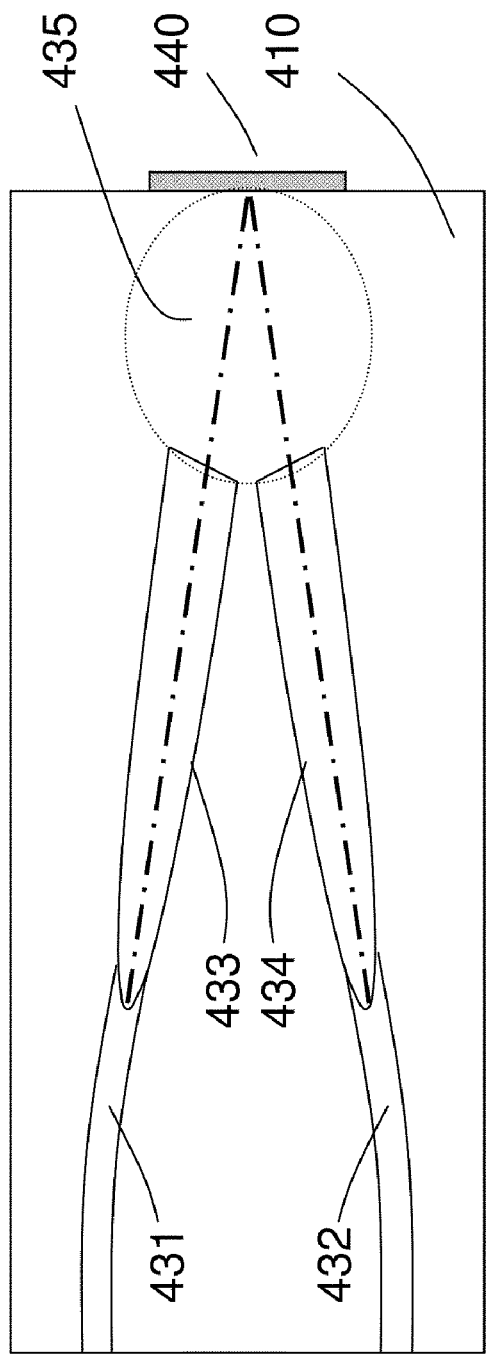
FIG. 4C depicts an OPAD according to an embodiment of the invention wherein wavelength filtering is achieved through a reflective interface and thin-film filter with waveguide horns.

Referring to FIGS. 4A through 4C there are depicted embodiments of the invention wherein a Thin-Film Filter (TFF) provides the required passband filtering within the OPAD. The TFF, with the functionality as described supra in respect of FIG. 3, is designed as a reflective filter for the signal wavelength range $\lambda_S$ and a transmitting filter for ASE wavelengths outside this range, $\lambda_{ASE} \leq \lambda_{PBF\_Lower}$ and $\lambda_{ASE} \geq \lambda_{PBF\_Upper}$, where $\lambda_{PBF\_Lower}$ and $\lambda_{PBF\_Upper}$ represent the lower and upper wavelength limits of the PBF provided by the TFF which may be set to the signal wavelength range $\lambda_S$ or toleranced to allow for environmental effects such as temperature. The TFF employs, for example, a multiple layer dielectric stack design (see for example JDS Uniphase Interference Filter Handbook, $2^{nd}$ Edition, 2007).

The basic idea of the embodiment featuring a TFF as the filtering element, i.e. Back PBF 360, between the amplification and detection sections is illustrated in FIG. 4A by a schematic of an OPAD 400A. Accordingly, OPAD 400A comprises optical substrate 410 upon which a MGVI waveguide structure has been grown and patterned, not references explicitly for clarity. Accordingly a first passive waveguide 411 receives an amplified optical signal from an amplification section 412 which comprises both passive and waveguide layers of the MGVI which receives an incoming signal from second passive waveguide 410. Amplification section 412 is shown schematically and is not intended to reflect the actual active-passive waveguide integration within MGVI platform which would be obvious to one skilled in the art. As a result both the incoming optical signals and forward propagating ASE, in the wavelengths $\lambda_S$ and $\lambda_{ASE}$, respectively, propagate towards the back facet 416 of the device where they impinge upon the TFF 413. The optical signals within predetermined wavelength range $\lambda_S$ are reflected from the TFF 413 and then coupled to a third passive waveguide 414, which is optically connected to the detection section 415 of the OPAD 400A. As with the amplification section 412 the detection section 415 is depicted schematically and is not intended to reflect the actual active-passive waveguide integration within an MGVI platform. All the wavelengths outside the pre-determined wavelength range $\lambda_S$ are transmitted through the TFF 413 and accordingly out of the PIC comprising OPAD 400A.

It would be apparent to one skilled in the art that optionally, a photodetector (not shown for clarity within this schematic sketch) may be provided behind TFF 413 to measure transmitted light outside the signal wavelength range, which is the forward ASE light, thereby providing a gain control of the amplification section of the OPAD 400A, as per block-diagram of OPAD 300 in FIG. 3 supra.

The design of the TFF 413 at the back facet 416 of the OPAD 400A should be adjusted to the angle of incidence of the first passive waveguide 411 such that the optical signals within the target wavelength range $\lambda_S$ are coupled into the second passive waveguide 414 after have been reflected by the TFF 413. Unlike conventional TFF designs which are intended for approximately normal (i.e. 0 degree) incidence, e.g. such as outlined by D. H. Cushing in U.S. Pat. No. 6,011,652 entitled "Multi-Layer Thin Film Dielectric Bandpass Filter" and P. J. Gasoli in U.S. Pat. No. 5,179,468 entitled "Interleaving of Similar Thin-Film Stacks for Producing Optical Interference Coatings", the TFF 413 is to be designed to operate with a larger angle of incidence, which still remains smaller than that corresponding to the angle of total internal reflection in the wavelengths outside the pre-determined wavelength range $\lambda_S$.

In contrast to the design simplicity for the embodiment outlined by FIG. 4A, the actual implementation is rather tricky, e.g. in part it requires a precise cleaving of the facet to be coated with the TFF 413, in a position pre-determined by the layout of the first and second passive waveguides, 411 and 414, respectively. If the precise cleaving, within a tolerance comparable to the waveguide width, i.e. on a micron scale in a case of typical shallow etched ridge waveguides in InP based materials operating in 1.3 µm or 1.5 µm wavelength ranges, is not an option, then certain design modifications can be implemented to mitigate the cleave tolerance.

One such modification is illustrated by FIG. 4B, which presents another embodiment according to the invention for an OPAD 400B featuring a TFF 425 at the device facet, where mitigation of the cleave tolerance is achieved by inserting a two-port multi-mode interferometer (MMI) 421 between the first and second passive waveguides, 422 and 423 respectively, and device facet 424 with TFF 425. First passive waveguide 422 couples signals from the amplification section 426 to the MMI 421 and second passive waveguide 423 couples the filtered signals from the MMI 421 to the detection section 427. For wavelengths in the pre-determined signal wavelength range $\lambda_S$, which are reflected by the TFF 425 back into the PIC chip, whereas the wavelengths outside this range are transmitted through the TFF 425 and out of PIC chip, performance of the MMI 421, featuring input port 421A and output port 421B at the same facet, is equivalent to that of an MMI having double the length of MMI 421 with the input and output ports at the opposite facets (such a transmissive MMI not being shown in FIG. 4B). The design techniques exploiting the MMI 421 thereby enable increased tolerance of the two-port MMI to the length of the MMI 421 are well known and, in effect, reduced to providing a flat top passband in a port-to-port transmission spectrum, see for example L. Soldano et al in "Optical Multi-Mode Interference Devices Based on Self-Imaging: Principles and Applications" (J. Lightwave Tech., Vol. 13, No. 4, pp 615-627, April 1995).

In this way, deviations of the TFF 425 and back facet position, i.e. device facet 424, with regard to the front facet of the MMI 421, which are equivalent to the wavelength deviations, in terms of their impact on the port-to-port transmission, are less pronounced, thereby mitigating the effect of the cleave tolerance on the device performance. As an additional benefit, an MMI assisted back facet TFF solution allows use of conventional TFF designs intended for the normal incidence, e.g. as those outlined by D. H. Cushing in U.S. Pat. No. 6,011,652 entitled "Multi-Layer Thin Film Dielectric Bandpass Filter" and P. J. Gasoli in U.S. Pat. No. 5,179,468 entitled "Interleaving of Similar Thin-Film Stacks for Producing Optical Interference Coatings". It would be appreciated by one skilled in the art that the MMI 421 may also be designed to provide at least some aspect of wavelength filtering to act in a combination with the TFF 424.

It would also be evident to one skilled in the art that the TFF 425 may be provided as a discrete TFF element which is bonded to the device facet 424 or that it may be deposited onto the device facet 424. Optionally, a third output optical port may also be added to the MMI 421 and, accordingly, a third passive waveguide disposed that would lead to a second detection section, in use, acting as a monitor, such as Monitor Element 380 of FIG. 3 supra, to provide a gain control loop to the amplification section 426 of the OPAD 400B, these elements not shown in FIG. 4B for clarity. In this case, the equivalent optical circuit of the resulting PIC reproduces that of the back end of the generic OPAD 300 given in FIG. 3 supra, with the TFF 425, and optionally, MMI 421 serving as the Back PBF 360 and two detection sections of the active waveguide as Detector Element 370 and Monitor Element 380. To make such a functionality feasible, the tree-port MMI now has to transmit the optical signals in the wavelength range $\lambda_S$ to the output passive waveguide connected to a first detection section of the active waveguide, namely detection section 427 acting as the Detection Element 370, and the ASE light in the wavelengths outside the wavelength range $\lambda_S$ is coupled to another passive waveguide section leading to a second detection section of the active waveguide, operating as a Monitor Element 380.

Another design solution that allows mitigation of the cleave tolerance impact on the performance of the OPAD featuring the back facet TFF as a PBF between the amplification and detection sections of the device, is illustrated by OPAD 400C in FIG. 4C. Here, first and second passive waveguides 431 and 432 coupling optical signals from the amplification section and to the detection section respectfully, and not shown for clarity, are equipped with planar focusing elements 433 and 434, e.g. such as those described by W. K. Burns et al in "Optical Waveguide Parabolic Coupling Horns" (Appl. Phys. Lett. Vol. 30, pp 28-30, Jan. 1, 1977). These planar focusing elements 433 and 434 are intended to provide a parallel optical beam at the exit of the ridge waveguide into the slab waveguide 435, thereby reducing the beam divergence in the plane of the waveguide core. The slab waveguide terminating at a device facet upon which TFF 440 is bonded or deposited. Wavelengths within the pre-determined signal range $\lambda_S$ therefore will be reflected back into the chip by the TFF 440 at the facet, while the reflected beam in the slab waveguide will remain nearly parallel disregarding to the exact position of the cleaved facet in regard to the passive waveguides. The planar focusing elements 433 and 434 do not need to be identical and, quite opposite, it is perfectly conceivable that they have different shapes, e.g. the launching planar focusing element 433 at the end of the first passive waveguide 431, which is concatenated to the amplification section of the OPAD 400C, and not shown in FIG. 4C, can be designed to provide a parallel beam at small incident angle, whereas the collecting planar focusing element 434 at the start of the second passive waveguide 432, which leads to the detection section of the OPAD 400C, similarly not shown in FIG. 4C, can be optimized for coupling a wider and diverging two-dimensional optical beam, i.e. in a direction perpendicular to the plane of the FIG. 4C, light is confined in and around the passive waveguide core.

It would be apparent to one skilled in the art that in each of the embodiments described supra in respect of FIGS. 4A through 4C that the ASE light propagating through the TFF, being TFF 413, 425, 440 respectively, may optionally be monitored by providing a detector behind the TFF, thereby allowing control of the gain in the amplification section of the OPAD. This additional TFF may be disposed externally to the MGVI structure or alternatively wherein the TFF is disposed within a groove formed within the MGVI structure it may be disposed externally with a waveguide interconnection, for example a planar waveguide structure, or disposed within an additional feature implemented within the MGVI structure.

It would also be apparent to one skilled in the art that the embodiments presented supra employ a reflective TFF wherein optical signals $\lambda_S$ and $\lambda_{ASE}$ within the passband of the filter are reflected and coupled to the photodetector and that alternatively a transmissive TFF filter may be employed such that optical signals $\lambda_S$ and $\lambda_{ASE}$ within the passband of the filter are transmitted and those outside the passband reflected. Such transmissive TFF elements may be implemented within embodiments according to the invention by appropriate placement of the Detector Element 370 with or without the Monitoring Element 380 in relation to the transmissive TFF with or without planar waveguide elements between.

Finally, it would also be apparent that other waveguide elements and structures may be employed in conjunction with the TFF to implement the wavelength filtering of the ASE outside pre-determined signal wavelength range $\lambda_S$, see for example T. Augustsson in U.S. Pat. No. 7,423,658 entitled "Device and Method for Optical Add/Drop Multiplexing" and C. H. Henry et al in U.S. Pat. No. 5,596,661 entitled "Monolithic Optical Waveguide Filters Based on Fourier Expansion".

Figure 5:
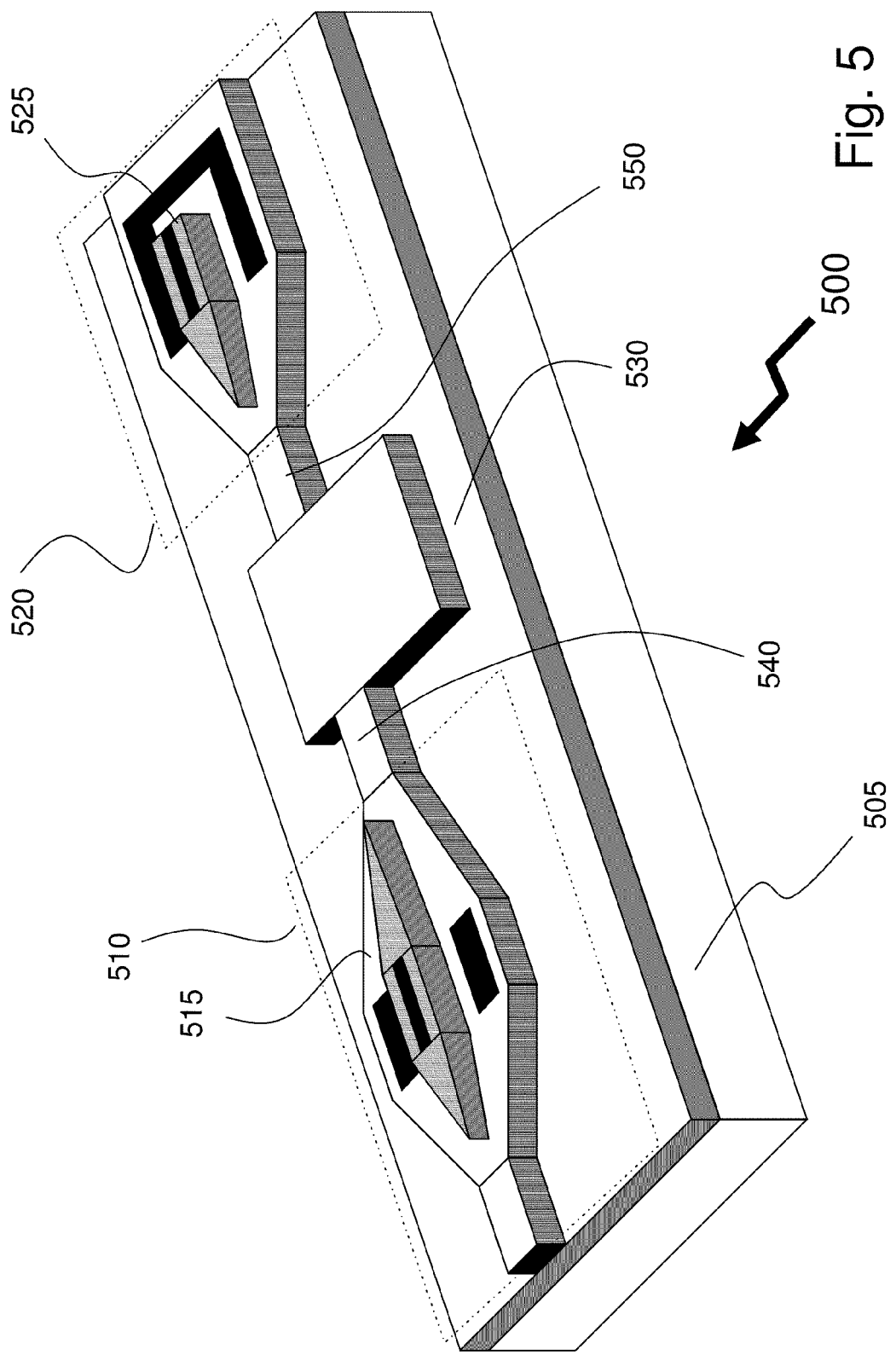
FIG. 5 depicts an OPAD according to an embodiment of the invention wherein wavelength filtering is achieved through a multimode interference filter employed within the passive waveguide layer.

Now referring to FIG. 5, there is shown a schematic of an OPAD 500 according to an embodiment of the invention, as outlined schematically in FIG. 3 supra, which includes an amplification section 510 (Gain Element 330 in FIG. 3) and a detection section 520 (Detector Element 360 in FIG. 3). ASE filtering is achieved by inserting an MMI 530, acting as Back PBF 360, with associated first and second passive waveguides 530 and 540 between the active waveguide sections 515 and 525 respectively providing the amplification section 510 and detection section 520. Similar to other embodiments of the invention, this integrated component OPAD 500 comprises a substrate 505 upon which an MGVI structure has been grown and processed, not identified explicitly for clarity. The MGVI structure and guided optical signal propagation therein, e.g. lateral taper assistant vertical transitions between the passive and active waveguides, being similar to that reported by V. Tolstikhin et al in "Optically Pre-Amplified Detectors for Multi-Guide Vertical Integration in InP" (Proc. Indium Phosphide and Related Materials 2009 Conference, pp. 155-158, Newport Beach, 2009).

It would be apparent that OPAD 500 differs from this prior art in that now an MMI 530 has been incorporated into the section of passive waveguide between the amplification and detection sections 510 and 520 respectively of the active waveguide, wherein the MMI 530 is defined on the same vertical layer as the passive waveguides, as illustrated by FIG. 5. The two-port MMI 530 is designed to operate as an optical passband filter, in accordance with the general description of the invention referring to FIG. 3. It receives amplified optical signals in the pre-determined wavelength range $\lambda_S$, along with ASE light in the wavelength range $\lambda_{ASE}$, which is usually broader than the signal range $\lambda_S$. It transmits, however, only wavelengths in the range $\lambda_{PBF}$, which, coincides with the signal wavelength range $\lambda_S$, such that these wavelengths enter the detection section 520 of the OPAD 500 and its active waveguide section 525 by, first, propagating into the second passive waveguide 550 between the MMI 530 and the detection section 520, and, second, being vertically transferred into the active waveguide 525 with assistance of vertical tapers defined at both the passive and active waveguide levels.

The design principles of the MMI 530 with intended wavelength filtering being well known, e.g. such as described in L. Soldano et al in "Optical Multi-Mode Interference Devices Based on Self-Imaging: Principles and Applications" (J. Lightwave Tech., Vol. 13, No. 4, pp 615-627, April 1995) and R. M. Jenkins et al in U.S. Pat. No. 5,428,698 "Optical Routing Device". It should be evident to those skilled in the art that the passive waveguide layer in the MGVI optimized for an efficient and controllable passive-active vertical coupling is also suitable for the required MMI passband filtering, by appropriate selection of the MMI shape and size, as well as adjusting the layout of the passive waveguides coming in and out of MMI filter.

Optionally, a second output optical port may be added to the MMI 560 and, accordingly, a second passive waveguide disposed that would lead to a second detection section, in use, acting as the Monitor Element 380 to provide a gain control loop to the amplification section of the OPAD, not shown for clarity in FIG. 5. In this case, the equivalent optical circuit of an integrated component reproduces that of the back end of the generic OPAD given in FIG. 3, with MMI 530 serving as a Back PBF 350 and two detection sections of the active waveguide as Detector Element 360 and Monitor 370, respectively. To make such a functionality feasible, the tree-port MMI now has to transmit the optical signals in the wavelength range $\lambda_S$ to the output passive waveguide connected to the first detection section of the active waveguide, acting as Detector Element 360, and the ASE light in the wavelengths outside the wavelength range $\lambda_S$-to the passive waveguide leading to the second detection section of the active waveguide, operating as Monitor 370.

Figure 6:
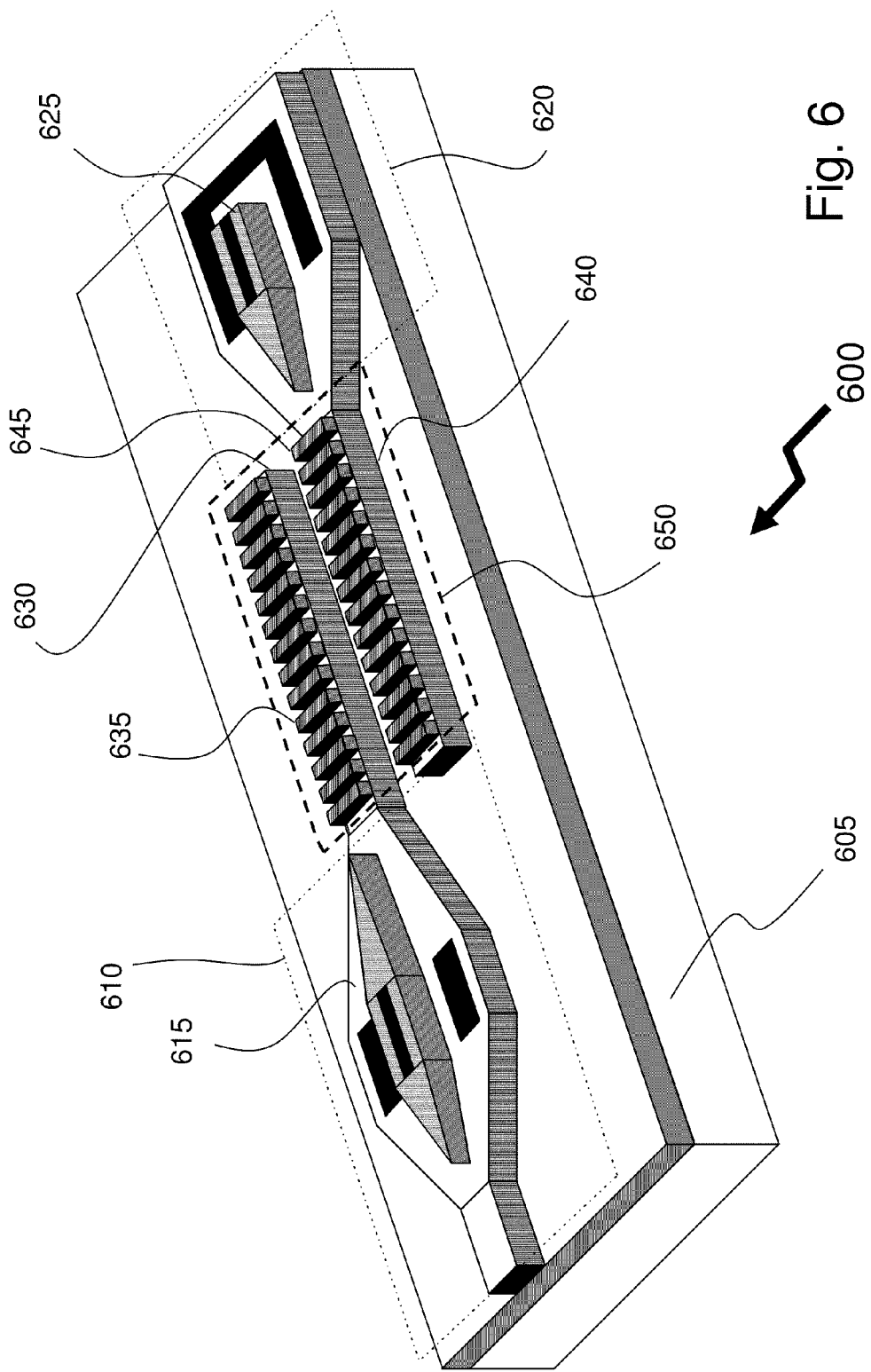
FIG. 6 depicts an OPAD according to an embodiment of the invention wherein wavelength filtering is achieved through a grating assisted lateral directional coupler formed within the passive waveguide layer.

Now referring to FIG. 6, there is shown a schematic of an OPAD 600 according to an embodiment of the invention, as outlined schematically in FIG. 3 supra, which includes an amplification section 610 (Gain Element 330 in FIG. 3) and a detection section 620 (Detector Element 360 in FIG. 3). ASE filtering is achieved by inserting a grating assisted directional coupler 650, acting as Back PBF 360, with associated first and second coupler waveguides 630 and 640 respectively between the amplification section 610 and detection section 620. The first and second coupler waveguides 630 and 640 each respectively having formed on their upper surface first and second gratings 635 and 645 such that the overall combination acts as grating assisted directional coupler 650. In common with other embodiments of the invention, this integrated component OPAD 600 comprises a substrate 605 upon which an MGVI structure has been grown and processed, not identified explicitly for clarity. The MGVI structure and guided optical signal propagation therein, e.g. lateral taper assistant vertical transitions between the passive and active waveguides, being similar to that reported by V. Tolstikhin et al in "Optically Pre-Amplified Detectors for Multi-Guide Vertical Integration in InP" (Proc. Indium Phosphide and Related Materials 2009 Conference, pp. 155-158, Newport Beach, 2009).

It would be apparent that OPAD 600 differs from this prior art in that now a grating assisted directional coupler 650 has been incorporated into the section of passive waveguide between the amplification and detection sections 610 and 620 respectively of the active waveguide, wherein the grating assisted directional coupler 650 is defined on the same vertical layer as the passive waveguides, as illustrated by FIG. 6. The grating assisted directional coupler 650 is designed to operate as an optical passband filter, in accordance with the general description of the invention referring to FIG. 3. It receives amplified optical signals in the pre-determined wavelength range $\lambda_S$, along with ASE light in the wavelength range $\lambda_{ASE}$, which is usually broader than the signal range $\lambda_S$. It transmits wavelengths in the range $\lambda_{PBF}$, which, coincides with the signal wavelength range $\lambda_S$, such that these wavelengths enter the detection section 620 of the OPAD 600 and its active waveguide section 625 by, first, propagating in the first coupler waveguide 630 and second coupling into the second coupler waveguide 640 before being vertically transferred into the active waveguide 625 with assistance of vertical tapers defined at both the passive and active waveguide levels. Signals outside of $\lambda_{PBF}$ at the output of the grating assisted directional coupler 650 are within the first coupler waveguide 630 wherein they are disposed.

The design principles of the grating assisted directional coupler 650 with intended wavelength filtering being well known, e.g. such as described by A. Carenco et al in U.S. Pat. No. 6,549,707 "Grating-Type Optical Filter with Apodised Spectral Response" and Y. Shibata et al in "Coupling Coefficient Modulation of Waveguide Grating using Sample Grating" (IEEE Phot. Tech. Lett., Vol. 6, pp. 1222-1224, 1994). It should be evident to those skilled in the art that the passive and active waveguide layers within the MGVI which are optimized for an efficient and controllable passive-active vertical coupling are also suitable for the required grating assisted directional coupler filtering, by appropriate selection of the grating structure, directional coupler waveguides, coupler transfer characteristic as well as appropriate design and adjustment of the layout of any passive waveguide sections disposed between the grating assisted directional coupler 650 and the amplification and detection sections 610 and 620, such passive waveguide sections not being shown within FIG. 6.

Optionally, a second output passive optical waveguide may be added to the output of the first coupler waveguide 630, and accordingly, when appropriately disposed would lead to a second detection section, which in use, acts as the Monitor Element 380 to provide a gain control loop to the amplification section of the OPAD, not shown for clarity in FIG. 6. In this case, the equivalent optical circuit of an integrated component reproduces that of the back end of the generic OPAD given in FIG. 3, with grating assisted directional coupler 650 serving as a Back PBF 350 and the two detection sections of the active waveguide as Detector Element 360 and Monitor 370, respectively. To make such a functionality feasible, the three-port directional coupler now has to transmit the optical signals in the wavelength range $\lambda_S$ to the output passive waveguide connected to the first detection section of the active waveguide, acting as Detector Element 360, and the ASE light in the wavelengths outside the wavelength range $\lambda_S$-to the passive waveguide leading to the second detection section of the active waveguide, operating as Monitor 370.

Now referring to FIG. 7, there is shown a schematic of an OPAD 700 according to an embodiment of the invention, as outlined schematically in FIG. 3 supra, which includes an amplification section 730 (Gain Element 330 in FIG. 3), a detection section 750 (Detector Element 360 in FIG. 3), and a monitoring section 745. ASE filtering for the detection section 750 is achieved by inserting a first grating assisted coupler 740, acting as Back PBF 360 whilst ASE filtering back into the optical network to which OPAD 700 is connected is achieved by inserting a second grating assisted coupler 725, acting as Front PBF 320. As with the other embodiments of the invention described supra in respect of FIGS. 4A through 6 supra this fully integrated implementation for OPAD 700 comprises a substrate 705 upon which an MGVI structure has been grown and processed, not identified explicitly for clarity. The MGVI structure and guided optical signal propagation therein, e.g. lateral taper assistant vertical transitions between the passive and active waveguides, being similar to that reported by V. Tolstikhin et al in "Optically Pre-Amplified Detectors for Multi-Guide Vertical Integration in InP" (Proc. Indium Phosphide and Related Materials 2009 Conference, pp. 155-158, Newport Beach, 2009).

It would be apparent that OPAD 700 differs from this prior art in that now a second grating assisted coupler 725 has been incorporated into the section of passive waveguide the input 710 and the amplification section 730 and a first grating assisted coupler 740 has been inserted between the amplification and detection sections 730 and 750 respectively of the active waveguide, wherein the first and second grating assisted couplers 740 and 725 respectively are defined on the same vertical layer as the passive waveguides, as illustrated by FIG. 7. Each of the first and second grating assisted couplers 740 and 725 respectively are designed to operate as optical passband filters, in accordance with the general description of the invention referring to FIG. 3. Consider the first grating assisted coupler 740 then it receives amplified optical signals in the pre-determined wavelength range $\lambda_S$, along with ASE light in the wavelength range $\lambda_{ASE}$, which is usually broader than the signal range $\lambda_S$ from the amplification section 730. It transmits, however, to a first output port only those wavelengths in the range $\lambda_{PBF}$, which, coincides with the signal wavelength range $\lambda_S$, such that these wavelengths enter the detection section 750 of the OPAD 700 and its active waveguide section, not identified explicitly for clarity. These optical signals within the range $\lambda_{PBF}$ propagating first within the passive waveguide between the first grating assisted coupler 740 and the detection section 750 before being vertically transferred into the active waveguide of the detection section 750 with assistance of vertical tapers defined at both the passive and active waveguide levels.

Similarly optical signals outside the range $\lambda_{PBF}$ are transmitted to a second output port of the first grating assisted coupler 740 such that these signals enter the monitoring section 745 of the OPAD 700 and its active waveguide section, not identified explicitly for clarity. These optical signals outside the range $\lambda_{PBF}$ propagating first within the passive waveguide between the first grating assisted coupler 740 and the monitoring section 745 before being vertically transferred into the active waveguide of the monitoring section 745 with assistance of vertical tapers defined at both the passive and active waveguide levels.

Now considering optical signals entering OPAD 700 these are coupled at input 710 to an input passive waveguide 715 and are then coupled into the second grating assisted coupler 725 which has been incorporated between the input passive waveguide 715 and the amplification section 730. As such second grating assisted coupler 725 receives optical signals from the preceding optical network in the pre-determined wavelength range $\lambda_S$, along with any out of band signals. It transmits, however, to a first output port only those wavelengths in the range $\lambda_{PBF}$, which, coincides with the signal wavelength range $\lambda_S$, such that these wavelengths enter the amplification section 730 of the OPAD 700 and its active waveguide section, not identified explicitly for clarity. Any signals received from the preceding optical network are coupled to the other output of the second grating assisted coupler 725 and are not coupled to the amplification section 730.

As discussed supra the amplification section 730 emits ASE bidirectionally and accordingly if the optical input 710 was connected directly to the amplification section 730 this ASE is coupled directly back into the preceding optical network where it may or may not be subject to filtering and attenuation prior to being launched into the main optical telecommunications network. However, OPAD 700 as discussed supra contains second grating assisted coupler 725. As such by reciprocity it transmits to the input passive waveguide 715 that portion of the ASE that is within the wavelength range, $\lambda_{PBF}$, which, coincides with the signal wavelength range $\lambda_S$, such that these wavelengths enter the input passive waveguide 715 and then are coupled into the preceding optical network. ASE outside of $\lambda_{PBF}$ is coupled to the other output of the second grating assisted coupler 725 and is coupled to reverse monitoring section 735. Accordingly OPAD 700 provides a monolithic implementation of the general description of the invention of FIG. 3. The signal from reverse monitoring section 735 may be combined with that from monitoring section 745 to provide control of either the amplification section 730 alone or the overall OPAD 700.

It would be apparent to one skilled in the art that as described supra in respect of FIG. 7 that the first and second grating assisted couplers 725 and 740 have been presented as having the same passband, namely $\lambda_{PBF}$. However, depending upon the performance requirements of the overall OPAD 700 and it's receiver path elements, namely amplification section 730 and detection section 750, it may be advantageous to design these with differing performance characteristics, which may include passband width, isolation etc. It would also be apparent that the design of OPAD 700 as presented has the input passive waveguide 710, amplification section 730, and detection section 750 formed within the same continuous passive waveguide. Alternatively the design may be adjusted such that desired optical signals, $\lambda_S$ within $\lambda_{PBF}$, are within each directional coupler crossed-over, so called cross state, rather than straight-through, so called bar state. Optionally one directional coupler may be designed to be in the bar state and the other directional coupler within the cross state. In each case the detection and monitoring sections 750 and 745 respectively would be juxtaposed as required.

Further, within FIGS. 6 and 7 supra each grating assisted coupler has been presented as a co-propagating directional coupler such that optical signals propagate from one end of the directional coupler to the other. Optionally with grating assisted directional couplers the design may be implemented as a contra-propagating directional coupler such that the filtered optical signals are not only coupled into the other arm of the directional coupler but are also reflected such that they are coupled from the same end of the directional coupler as the input. In such designs each of the outputs at the other end of the directional coupler contains unwanted signals and may each be coupled to discrete photodetectors, i.e. duplicate monitoring sections 745 or reverse monitoring sections 735, or a single large photodetector coupled to both. If implemented within the first grating assisted coupler 740 then the position of detection section 750 would also be adjusted.

It would be apparent in the embodiments presented supra that the wavelength filtering elements, grating assisted directional coupler and MMI, represent only two of the possible embodiments for wavelength filtering elements possible within PICs. Optionally the wavelength filtering may include other structures, including but not limited to, Mach-Zehnder interferometers (MZI), echelle gratings, directional couplers, and array waveguide gratings (AWG). Further it would be evident to one skilled in the art that whilst the embodiments presented supra employ transmissive waveguide filtering elements such as MMI 530 and grating assisted directional coupler 670 alternate design options exist including reflective filtering elements which can be employed with commensurate placement of detector elements etc.

Optionally different structures may be implemented for the Front PBF 320 and the Back PBF 350 within a fully monolithic waveguide solution, or a monolithic waveguide solution for one of these PBFs may be used in conjunction with a TFF solution for the other. Alternatively both PBFs may be implemented using a single TFF or dual TFFs. The particular implementation being determined for example by factors including but not limited to, the wavelength filtering requirements of the standard or system with which the OPAD is intended to operate, performance constraints of other PIC functions within the PIC of which the OPAD forms part, cost, footprint, performance etc.

Additionally alternative embodiments of the OPAD are possible without departing from the scope of the invention, including for example providing multiple detector elements coupled from a single amplification section for applications ranging from Wavelength Division Multiplexing PON, local area networks, metropolitan area networks, and long-haul applications, and providing wavelength filtering from a cascade of two or more elements.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A photonic component comprising:
   a) an epitaxial semiconductor structure grown in a III-V semiconductor material system in a single growth step upon a substrate comprising a common designated waveguide for supporting propagation of optical signals within a predetermined first wavelength range and at least one of a plurality of wavelength designated waveguides vertically disposed in order of increasing wavelength bandgap, each of the plurality of wavelength designated waveguides supporting a predetermined second wavelength range, each of the predetermined second wavelength ranges being within the predetermined first wavelength range;
   b) an optical input port for receiving optical signals within the first wavelength range;
   c) a first filter comprising at least a first output port and a second output port and characterized by at least a first passband width, the filter optically coupled to the optical input port for receiving optical signals within the first wavelength range and for providing a first predetermined portion of the received optical signals to the first output port, the first predetermined portion of the received optical signals being determined in dependence upon at least the first passband width;

d) an optical amplifier comprising at least a gain section formed within the one of the plurality of wavelength designated waveguides, a first contact for forward biasing the optical amplifier, and a third output port, the optical amplifier optically coupled to the first output port for receiving the first predetermined portion of the received optical signals and providing amplified filtered optical signals to the third output port;

e) a second filter comprising at least a fourth output port and a fifth output port and characterized by at least a second passband width, the filter optically coupled to the third output port of the optical amplifier and for providing a first predetermined portion of the amplified filtered optical signals to the fourth output port and a second predetermined portion of the amplified filtered optical signals to the fifth output port, the first and second predetermined portions of the amplified filtered optical signals being determined in dependence upon at least the second passband width;

f) a first photodetector optically comprising at least a second contact for reverse biasing the first photodetector, the first photodetector being coupled to the fourth output port of the second filter for receiving the first predetermined portion of the amplified filtered optical signals;

g) a second photodetector optically coupled to the fifth output port of the second filter for receiving the second predetermined portion of the amplified filtered optical signals; and h) a third photodetector optically coupled to the second output port of the first filter for receiving a predetermined portion of optical signals propagating from the optical amplifier to the first filter, the predetermined portion of the optical signals determined in dependence upon at least the first passband width; wherein, the first contact and second contact are formed upon the same layer of the epitaxial semiconductor structure but are electrically isolated from one another.

2. A photonic component according to claim 1 wherein:

at least one of the first photodetector, the second photodetector, the third photodetector and the optical amplifier comprise a vertical element for coupling an optical signal within the predetermined second wavelength range of the one of the plurality of wavelength designated waveguides from the common designated waveguide to the one of the plurality of wavelength designated waveguides, the vertical element comprising at least one lateral taper formed by at least one semiconductor etching process within each of the common designated waveguide, the one of the plurality of wavelength designated waveguides, and any intermediate ones of the plurality of wavelength designated waveguides between the common designated waveguide and the one of the plurality of wavelength designated waveguides.

3. A photonic component according to claim 1 wherein, at least one of the first filter and second filter comprise at least one of a thin-film filter and a waveguide filter implemented within the epitaxial semiconductor structure.

4. A photonic component according to claim 3 wherein, when the at least one of is a thin-film filter it is at least one of abutting a facet of the epitaxial semiconductor structure, deposited upon a facet of the epitaxial semiconductor structure, and disposed within a feature formed within a surface of the epitaxial semiconductor structure.

5. A photonic component according to claim 3 wherein, when the at least one of is a waveguide filter it comprises at least a first element selected from the group comprising, a multimode interference filter, a directional coupler, a Mach-Zehnder interferometer, an array waveguide grating, an echelle grating, a Bragg grating, and a ring resonator.

6. A photonic component according to claim 3 wherein, when the at least one of is a waveguide filter a first predetermined portion of the waveguide filter is implemented within one of the common designated waveguide and another one of the plurality of wavelength designated waveguides, the one being adjacent to the one of the plurality of wavelength designated waveguides.

7. A photonic component comprising:

a) an epitaxial semiconductor structure grown in a III-V semiconductor material system grown in a single growth step upon a substrate comprising a common designated waveguide for supporting propagation of optical signals within a predetermined first wavelength range and at least one of a plurality of wavelength designated waveguides vertically disposed in order of increasing wavelength bandgap, each of the plurality of wavelength designated waveguides supporting a predetermined second wavelength range, each of the predetermined second wavelength ranges being within the predetermined first wavelength range;

b) an optical input port for receiving optical signals within the first wavelength range;

c) an optical amplifier comprising at least a gain section formed within the one of the plurality of wavelength designated waveguides, a first contact for forward biasing the optical amplifier, and a first output port, the optical amplifier optically coupled to the optical input port for receiving the optical signals and providing amplified optical signals to the first output port;

d) a first filter comprising at least a second output port and characterized by at least a first passband width, the filter optically coupled to the first output port of the optical amplifier and for providing a first predetermined portion of the amplified optical signals to the second output port, the first predetermined portion of the amplified optical signals being determined in dependence upon at least the first passband width;

e) a first photodetector optically comprising at least a second contact for reverse biasing the first photodetector, the first photodetector being coupled to the second output port of the first filter for receiving the first predetermined portion of the amplified optical signals; wherein the first contact and second contact are formed upon the same layer of the epitaxial semiconductor structure but are electrically isolated from one another.

8. A photonic component according to claim 7 wherein, at least one of the optical amplifier, the first filter, and the first photodetector further comprise a vertical element for coupling an optical signal within the predetermined second wavelength range of the one of the plurality of wavelength designated waveguides between at least one of from and to the common designated waveguide and at least one of to and from one of the plurality of wavelength designated waveguides, the vertical element comprising at least one lateral taper formed by at least one semiconductor etching process within each of the common designated waveguide, the one of the plurality of wavelength designated waveguides, and any intermediate ones of the plurality of wavelength designated waveguides between the common designated waveguide and the one of the plurality of wavelength designated waveguides.

9. A photonic component according to claim 7 further comprising;
   f) a second photodetector optically connected to the first filter and for receiving a second predetermined portion of the amplified optical signals, the second predetermined portion of the amplified optical signals being determined in dependence upon at least the first passband width.

10. A photonic component according to claim 7 further comprising;
    f) a second filter disposed between the input port and the optical amplifier and characterized by at least a second passband width, the filter for providing at least one of a third predetermined portion of the received optical signals to the optical amplifier and a first predetermined portion of noise generated by the optical amplifier to the input port, the at least one the third predetermined portion of the at least one of received optical signals and the first predetermined portion of the noise generated by the optical amplifier being determined in dependence upon at least the second passband width.

11. A photonic component according to claim 9 further comprising;
    g) a third photodetector optically connected to the second filter and for receiving a second predetermined portion of the noise generated by the optical amplifier, the second predetermined portion of the noise generated by the optical amplifier being determined in dependence upon at least the second passband width.

12. A photonic component according to claim 7 wherein, the first filter comprises at least one of a thin-film filter and a waveguide filter implemented within the epitaxial semiconductor structure.

13. A photonic component according to claim 10 wherein, the second filter comprises at least one of a thin-film filter and a waveguide filter implemented within the epitaxial semiconductor structure.

14. A photonic component according to claim 12 wherein, when the at least one of is a thin-film filter it is at least one of abutting a facet of the epitaxial semiconductor structure, deposited upon a facet of the epitaxial semiconductor structure, and disposed within a feature formed within a surface of the epitaxial semiconductor structure.

15. A photonic component according to claim 13 wherein, when the at least one of is a thin-film filter it is at least one of abutting a facet of the epitaxial semiconductor structure, deposited upon a facet of the epitaxial semiconductor structure, and disposed within a feature formed within a surface of the epitaxial semiconductor structure.

16. A photonic component according to claim 12 wherein, when the at least one of is a waveguide filter it comprises at least one of a first predetermined portion of the waveguide filter implemented within one of the common designated waveguide and another one of the plurality of wavelength designated waveguides, the one being adjacent to the one of the plurality of wavelength designated waveguides and at least a first element selected from the group comprising, a multimode interference filter, a directional coupler, a Mach-Zehnder interferometer, an array waveguide grating, an echelle grating, a Bragg grating, and a ring resonator.

17. A photonic component according to claim 13 wherein, when the at least one of is a waveguide filter it comprises at least one of a first predetermined portion of the waveguide filter implemented within one of the common designated waveguide and another one of the plurality of wavelength designated waveguides, the one being adjacent to the one of the plurality of wavelength designated waveguides and at least a first element selected from the group comprising, a multimode interference filter, a directional coupler, a Mach-Zehnder interferometer, an array waveguide grating, an echelle grating, a Bragg grating, and a ring resonator.

18. A photonic component according to claim 7 further comprising;
    f) at least one optical element of a plurality of optical elements disposed at least one of between the optical amplifier and first filter and between the first filter and first photodetector, the optical element comprising at least one of a waveguide filter element, a predetermined portion of a multimode interference waveguide element, a predetermined portion of a directional coupler, a predetermined portion of a Mach-Zehnder interferometer, a parabolic waveguide element, a planar waveguide, and a lens.

19. A photonic component according to claim 11 further comprising;
    h) at least one optical element of a plurality of optical elements disposed at least one of between the optical amplifier and the second filter, between the input port and the second filter, and between the second filter and third photodetector, the optical element comprising at least one of a waveguide filter element, a predetermined portion of a multimode interference waveguide element, a predetermined portion of a directional coupler, a predetermined portion of a Mach-Zehnder interferometer, a parabolic waveguide element, a planar waveguide, and a lens.

* * * * *